(12) United States Patent
Park et al.

(10) Patent No.: US 10,756,092 B2
(45) Date of Patent: Aug. 25, 2020

(54) METHOD OF FABRICATING SEMICONDUCTOR DEVICE

(71) Applicant: Samsung Electronics Co., Ltd., Suwon-si, Gyeonggi-do (KR)

(72) Inventors: Jonghyuk Park, Hwaseong-si (KR); Byoungho Kwon, Hwaseong-si (KR); Inho Kim, Ansan-si (KR); Hyesung Park, Anyang-si (KR); Jin-Woo Bae, Yongin-si (KR); Yanghee Lee, Incheon (KR); Inseak Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/814,387

(22) Filed: Mar. 10, 2020

(65) Prior Publication Data
US 2020/0212047 A1 Jul. 2, 2020

Related U.S. Application Data

(63) Continuation of application No. 16/386,731, filed on Apr. 17, 2019, now Pat. No. 10,622,364, which is a
(Continued)

(30) Foreign Application Priority Data

May 13, 2015 (KR) .................. 10-2015-0066801

(51) Int. Cl.
H01L 27/108 (2006.01)
H01L 21/66 (2006.01)

(52) U.S. Cl.
CPC .. H01L 27/10855 (2013.01); H01L 27/10814 (2013.01); H01L 27/10817 (2013.01);
(Continued)

(58) Field of Classification Search
CPC ......... H01L 27/10855; H01L 27/10814; H01L 27/10817; H01L 27/10823; H01L 27/10876
See application file for complete search history.

(56) References Cited

U.S. PATENT DOCUMENTS 7,436,014 B2 10/2008 Son
7,501,668 B2 3/2009 Jang et al.
(Continued)

FOREIGN PATENT DOCUMENTS

JP 3279302 B2 4/2002
JP 2005-243689 A 9/2005
(Continued)

OTHER PUBLICATIONS

U.S. Office Action dated Oct. 18, 2018 issued in co-pending U.S. Appl. No. 15/093,033.
(Continued)

Primary Examiner — Seahvosh Nikmanesh
(74) Attorney, Agent, or Firm — Harness, Dickey & Pierce, P.L.C.

(57) ABSTRACT

A method of fabricating a semiconductor device includes providing a substrate including a pair of first regions and a second region therebetween, forming first patterns on the respective first regions to at least partially define a stepwise portion at the second region, and forming a dummy pattern that at least partially fills the stepwise portion. The dummy pattern may be an electrically floating structure. The dummy pattern may be formed as part of forming second patterns on the respective first regions, and the dummy pattern and the second patterns may include substantially common materials. Because the dummy pattern at least partially fills the stepwise portion at the second region, the material layer
(Continued)

covering the second patterns and the dummy pattern may omit a corresponding stepwise portion.

20 Claims, 27 Drawing Sheets

Related U.S. Application Data continuation of application No. 15/093,033, filed on Apr. 7, 2016, now abandoned.

(52) U.S. Cl.
CPC .. *H01L 27/10823* (2013.01); *H01L 27/10876* (2013.01); *H01L 22/30* (2013.01); *H01L 22/34* (2013.01)

(56) References Cited

U.S. PATENT DOCUMENTS

| | | | |
|---|---|---|---|
| 8,927,426 | B2 | 1/2015 | Lee et al. |
| 9,018,768 | B2 | 4/2015 | Park et al. |
| 9,240,330 | B2 | 1/2016 | Takeda et al. |
| 2009/0256182 | A1 | 10/2009 | Sukekawa |
| 2013/0020719 | A1 | 1/2013 | Jung et al. |
| 2013/0087855 | A1 | 4/2013 | Makiyama et al. |
| 2013/0181330 | A1 | 7/2013 | Ramachandran et al. |
| 2015/0102395 | A1 | 4/2015 | Park et al. |
| 2015/0108605 | A1 | 4/2015 | Park et al. |
| 2015/0145124 | A1 | 5/2015 | Kang et al. |
| 2016/0020145 | A1 | 1/2016 | Lee et al. |
| 2016/0336327 | A1 | 11/2016 | Park et al. |

FOREIGN PATENT DOCUMENTS

| | | |
|---|---|---|
| KR | 1999-0081483 | 11/1999 |
| KR | 2000-0075305 A | 12/2000 |
| KR | 10-0555486 B1 | 3/2006 |
| KR | 10-2006-0124315 | 12/2006 |
| KR | 10-0753134 B1 | 8/2007 |
| KR | 10-0868925 B1 | 11/2008 |
| KR | 10-2011-0077964 | 7/2011 |

OTHER PUBLICATIONS

U.S. Notice of Allowance dated Dec. 3, 2019 in corresponding U.S. Appl. No. 16/386,731.
U.S. Office Action dated Jan. 27, 2020 for corresponding U.S. Appl. No. 16/110,658.
U.S. Notice of Allowance dated Apr. 3, 2020 for corresponding U.S. Appl. No. 16/110,658.

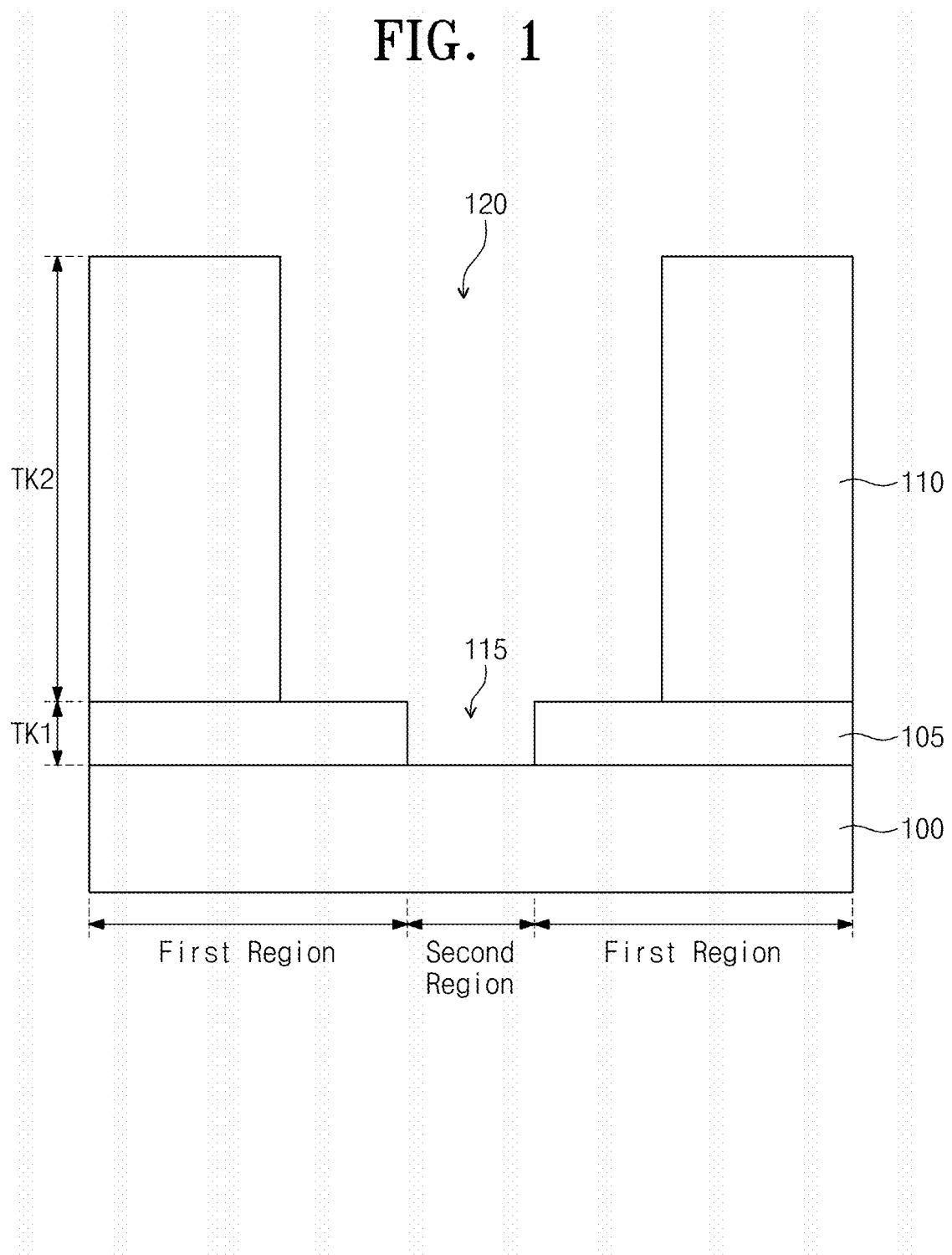

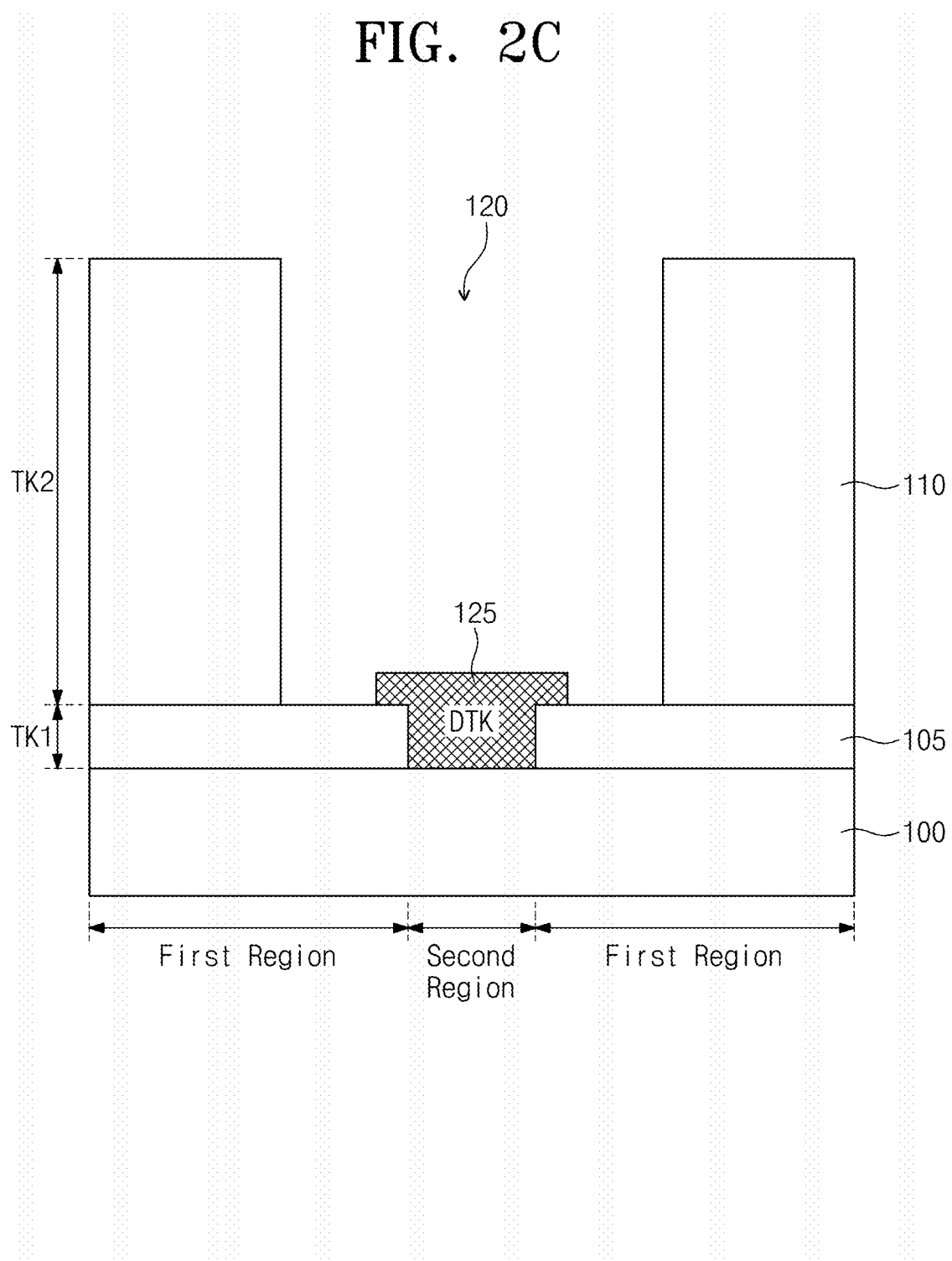

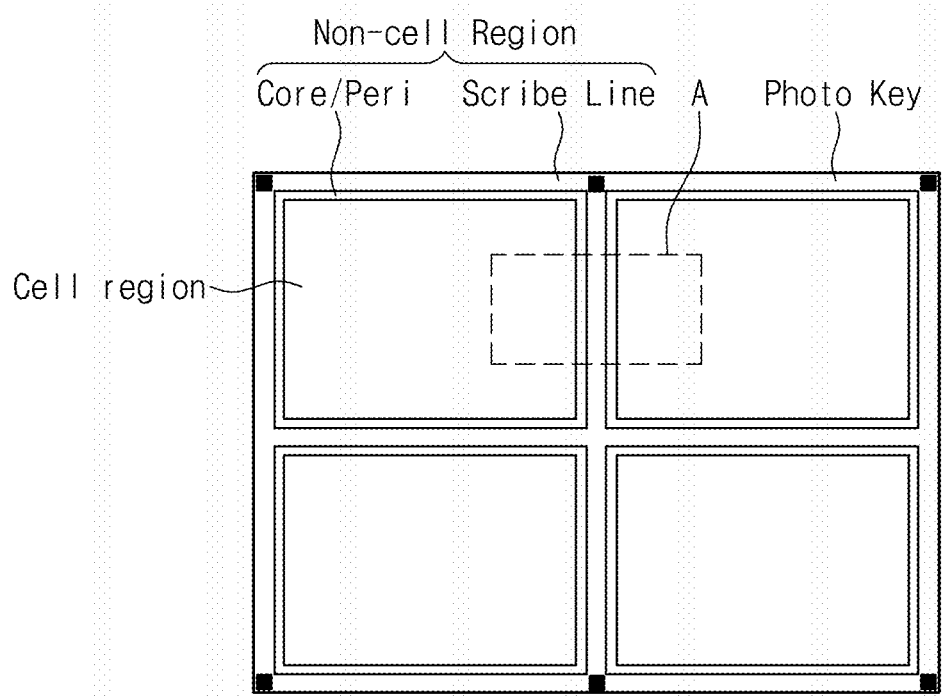

METHOD OF FABRICATING SEMICONDUCTOR DEVICE

CROSS-REFERENCE TO RELATED APPLICATIONS

This application is a continuation of U.S. non-provisional patent application Ser. No. 16/386,731, filed on Apr. 17, 2019, which is a continuation of U.S. non-provisional patent application Ser. No. 15/093,033, filed on Apr. 7, 2016, which claims priority under 35 U.S.C. § 119 to Korean Patent Application No. 10-2015-0066801, filed on May 13, 2015, in the Korean Intellectual Property Office, the entire contents of each of which are hereby incorporated by reference.

BACKGROUND OF THE INVENTION

Example embodiments of the inventive concepts relate to a method of fabricating a semiconductor device, and in particular, to a method of fabricating a highly-reliable and highly-integrated semiconductor device.

Due to their small-size, multifunctional, and/or low-cost characteristics, semiconductor devices are widely used as important elements in the electronic industry. With advances in the electronic industry, semiconductor devices are becoming more integrated.

In some cases, increased integration of semiconductor devices may result in various technical issues. For example, as an integration density of semiconductor devices increase, patterns included in the semiconductor devices may have a decreasing line width and/or space and an increasing height and/or aspect ratio. In some cases, one or more of a such decreased line width and/or space and increasing height and/or aspect ratio of patterns of semiconductor devices may lead to one or more of an increased difficulties in a layer deposition process according to which semiconductor devices are at least partially fabricated, reduced uniformity in an etching process according to which semiconductor devices are at least partially fabricated, and deterioration in reliability of the fabricated semiconductor devices.

SUMMARY

Example embodiments of the inventive concepts provide a method of fabricating a highly-reliable and highly-integrated semiconductor device.

According to some example embodiments of the inventive concepts, a method of fabricating a semiconductor device may include providing a substrate, the substrate including two first regions and a second region provided therebetween, forming first patterns on the first regions, respectively, the first patterns and the substrate defining a stepwise portion at the second region, forming second patterns on the first patterns respectively to form a dummy pattern on the stepwise portion of the second region, and forming a material layer to cover the second patterns and the dummy pattern.

In some example embodiments, the dummy pattern and the second patterns include substantially common materials.

In some example embodiments, the method may further include polishing a top surface of the material layer.

According to some example embodiments of the inventive concepts, a method of fabricating a semiconductor device may include providing a substrate including two cell regions and a non-cell region provided therebetween, forming lower structures on the cell regions, respectively, the lower structures and the substrate defining a first stepwise portion at the non-cell region, forming capacitors, each of which is electrically separated from the lower structures and includes a first electrode, a dielectric layer, and a second electrode, on the lower structures, forming a plate electrode on the cell regions to form a first dummy pattern on the first stepwise portion, the plate electrode electrically coupling the second electrodes of the capacitors to each other, and forming an insulating layer to cover the plate electrode and the first dummy pattern.

In some example embodiments, the first dummy pattern and the plate electrode include substantially common materials.

In some example embodiments, at least one lower structure of the lower structures includes at least one of a device isolation pattern, a transistor, and a bit line.

In some example embodiments, the method may further include polishing a top surface of the insulating layer.

In some example embodiments, the method may further include forming an auxiliary structure on the non-cell region, exposing the auxiliary structure to simultaneously form a first lower structure on the cell regions and form a first opening on the non-cell region, and forming a second lower structure on the cell regions to form a second dummy pattern filling the first opening.

In some example embodiments, the first opening includes a hole-shaped structure or a line-shaped structure.

In some example embodiments, the second dummy pattern fills the first opening and has a shape corresponding to a shape of the first opening.

In some example embodiments, the second dummy pattern partially fills the first opening.

In some example embodiments, the auxiliary structure comprises at least one of a photo key, an electrical test pattern, and a measurement site.

In some example embodiments, the method may further include forming a photo key on the non-cell region, forming a device isolation pattern on the cell regions and the non-cell region to define active patterns on the cell regions and active patterns on the non-cell region, forming a plurality of transistors on the cell regions, each transistor including a gate electrode crossing active patterns of the cell regions, the active patterns including first and second impurity regions, forming a first interlayered insulating layer on the cell regions and the non-cell region, exposing the photo key and at least a portion of the device isolation pattern on the non-cell region, and patterning the first interlayered insulating layer of the cell regions to form first contact holes exposing the first impurity regions, the patterning being based on a photolithography process using the photo key. The exposed portion of the device isolation pattern of the non-cell region may be etched during the forming of the first contact holes to form a first opening. The method may further include filling the first contact holes and the first opening with a first conductive layer to form first contact plugs and a second dummy pattern.

In some example embodiments, the forming of the plurality of transistors may include forming recesses to cross the active patterns of the cell regions, forming a gate insulating layer to conformally cover the recesses, forming the gate electrodes to respectively fill lower portions of the recesses covered with the gate insulating layer, forming capping patterns to respectively fill upper portions of the recesses, and injecting impurities into portions of the active patterns to form the first and second impurity regions, the active patterns being exposed at both sides of each of the capping pattern.

In some example embodiments, the method may further include forming bit lines on the cell regions to electrically couple the first contact plugs to each other, forming a second interlayered insulating layer to cover the cell regions provided with the bit lines and the non-cell region, exposing the photo key of the non-cell region, and patterning the first and second interlayered insulating layers to form second contact holes exposing the second impurity regions, the patterning the first and second interlayered insulating layers being based on a photolithography process using the photo key. During the forming of the second contact holes, a dummy hole may be formed on the non-cell region. Thereafter, the second contact holes and the dummy hole may be filled with a second conductive layer to form second contact plugs and a third dummy pattern.

In some example embodiments, the second dummy pattern may include a pillar-shaped structure penetrating the first and second interlayered insulating layers.

In some example embodiments, the second dummy pattern may include a pillar portion and a cover portion, the pillar portion penetrating the first and second interlayered insulating layers, the cover portion being connected to the pillar portion, such that the pillar portion and the cover portion form a "T"-shaped section of the second dummy pattern.

In some example embodiments, each of the cell regions may include a chip region provided with the bit lines and a core/peripheral region, which is configured to enable electrical signal transmission from/to the cell regions. Here, the forming of the bit lines on the cell regions may further include forming a core/peripheral gate electrode on the core/peripheral region.

In some example embodiments, a method of fabricating a semiconductor device includes forming first patterns on respective first regions of a substrate, the substrate including a second region between the first regions, the first patterns and the substrate defining a first stepwise portion at the second region, and forming a dummy pattern on the first stepwise portion to at least partially fill the first stepwise portion.

In some example embodiments, a method of fabricating a semiconductor device further includes forming second patterns on respective first patterns of the plurality of first patterns such that the dummy pattern, first patterns and the second patterns define a second stepwise portion at the second region, forming a material layer to cover at least the first patterns, second patterns, and the dummy pattern, the material layer including a stepwise portion corresponding to the second stepwise portion, the material layer omitting another stepwise portion corresponding to the first stepwise portion based on the dummy pattern at least partially filling the first stepwise portion, and polishing at least the stepwise portion of the material layer to form a uniform top surface of the material layer.

In some example embodiments, each first region is a cell region, each second region is a non-cell region, and each first pattern includes at least one of a device isolation pattern, an active pattern, a transistor, and a bit line.

In some example embodiments, a method of fabricating a semiconductor device further includes forming capacitors on the first patterns, wherein each capacitor is electrically separated from the first patterns, and each capacitor includes a first electrode, a dielectric layer, and a second electrode, and forming a plate electrode on the cell regions to form the dummy pattern, the plate electrode electrically coupling the second electrodes of the capacitors to each other.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 1, 2A, 2B, 2C, 3, and 4 are sectional views illustrating a method of fabricating a semiconductor device, according to some example embodiments of the inventive concepts.

FIG. 5 is a block diagram illustrating a conventional semiconductor device, according to some example embodiments of the inventive concepts.

Figure 2A:
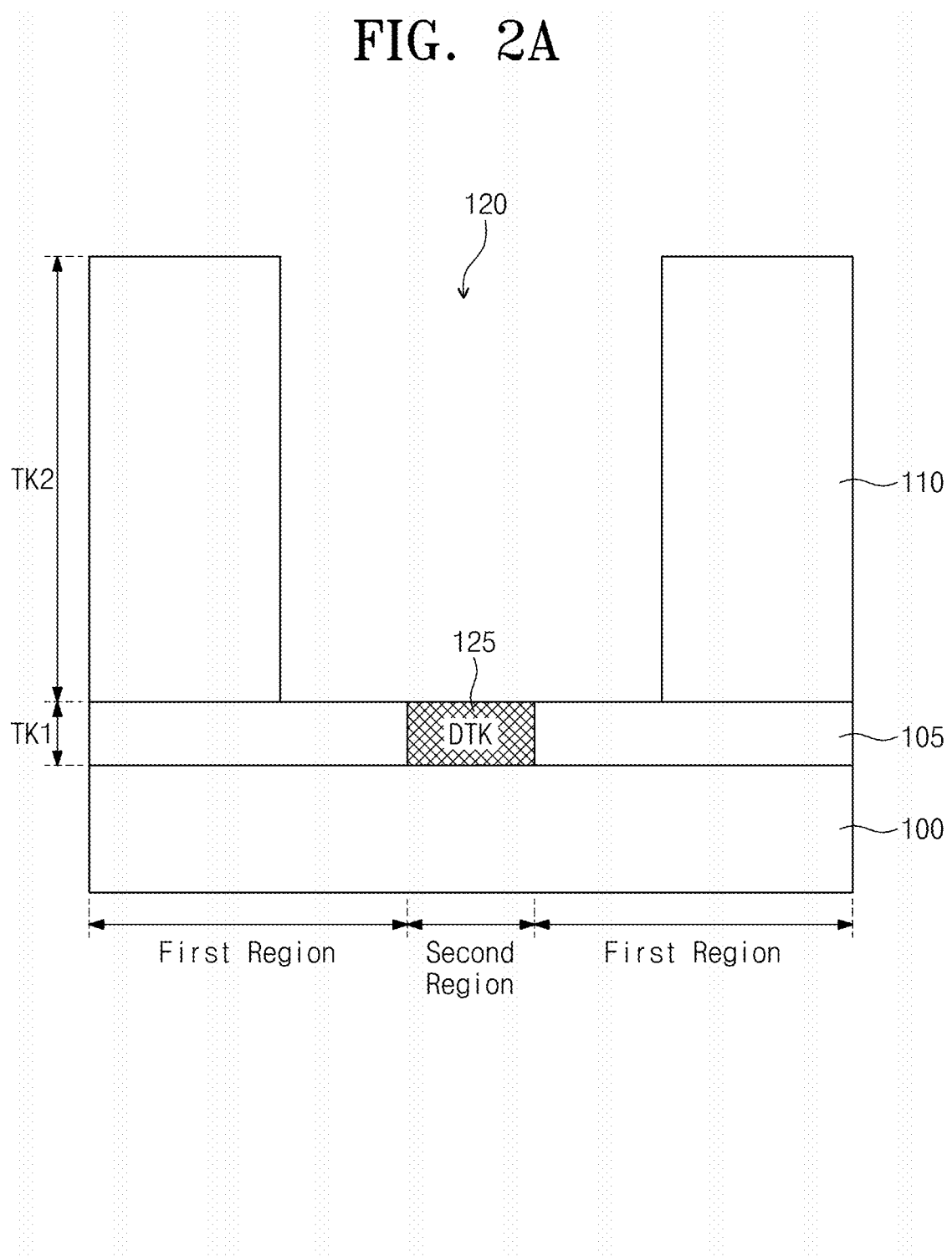

It should be noted that these figures are intended to illustrate the general characteristics of methods, structure and/or materials utilized in some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," when used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIGS. 1, 2A, 2B, 2C, 3, and 4 are sectional views illustrating a method of fabricating a semiconductor device, according to some example embodiments of the inventive concepts.

Referring to FIG. 1, a substrate 100 may be provided. The substrate 100 may include a pair of first regions and a second region provided between the pair of first regions.

First patterns 105 may be formed on the first regions of the substrate 100, respectively, and second patterns 110 may be formed on the first patterns 105, respectively, to expose at least a portion of each of the first patterns 105.

In more detail, the formation of the first patterns 105 may include forming a first layer (not shown) having a first thickness TK1 on the first and second regions of the substrate 100 and patterning the first layer to expose the second region of the substrate 100. The second region may include a first opening 115 that is defined by the substrate 100 and the first patterns 105. The first opening 115 may have a depth that is substantially equal to the first thickness TK1, greater than the first thickness TK1, or smaller than the first thickness TK1.

In some example embodiments, the first opening 115 may have a line-shaped structure extending in a specific direction. Alternatively, the first opening 115 may have a hole-shaped structure. However, the first opening 115 may not be limited to the line-shaped structure or hole-shaped structure.

The formation of the second patterns 110 may include forming a second layer (not shown) on the substrate 100 provided with the first patterns 105 to have a second thickness TK2 greater than the first thickness TK1, and patterning the second layer to expose at least a portion of the first patterns 105 and the second region of the substrate 100. Accordingly, a second opening 120, which is connected to the first opening 115 and is defined by the first patterns 105 and the second patterns 110, may be formed on the first opening 115. The second opening 120 may have a depth that is substantially equal to the second thickness TK2.

Although not shown, in some example embodiments, at least one additional layer may be inserted between the first pattern 105 and the second pattern 110.

As shown in FIG. 1, the substrate 100 and the first and second patterns 105 and 110 may be formed to define two stepwise portions. For example, the two stepwise portions may be formed between the substrate 100 and the first pattern 105 and between the first pattern 105 and the second pattern 110.

Figure 2B:
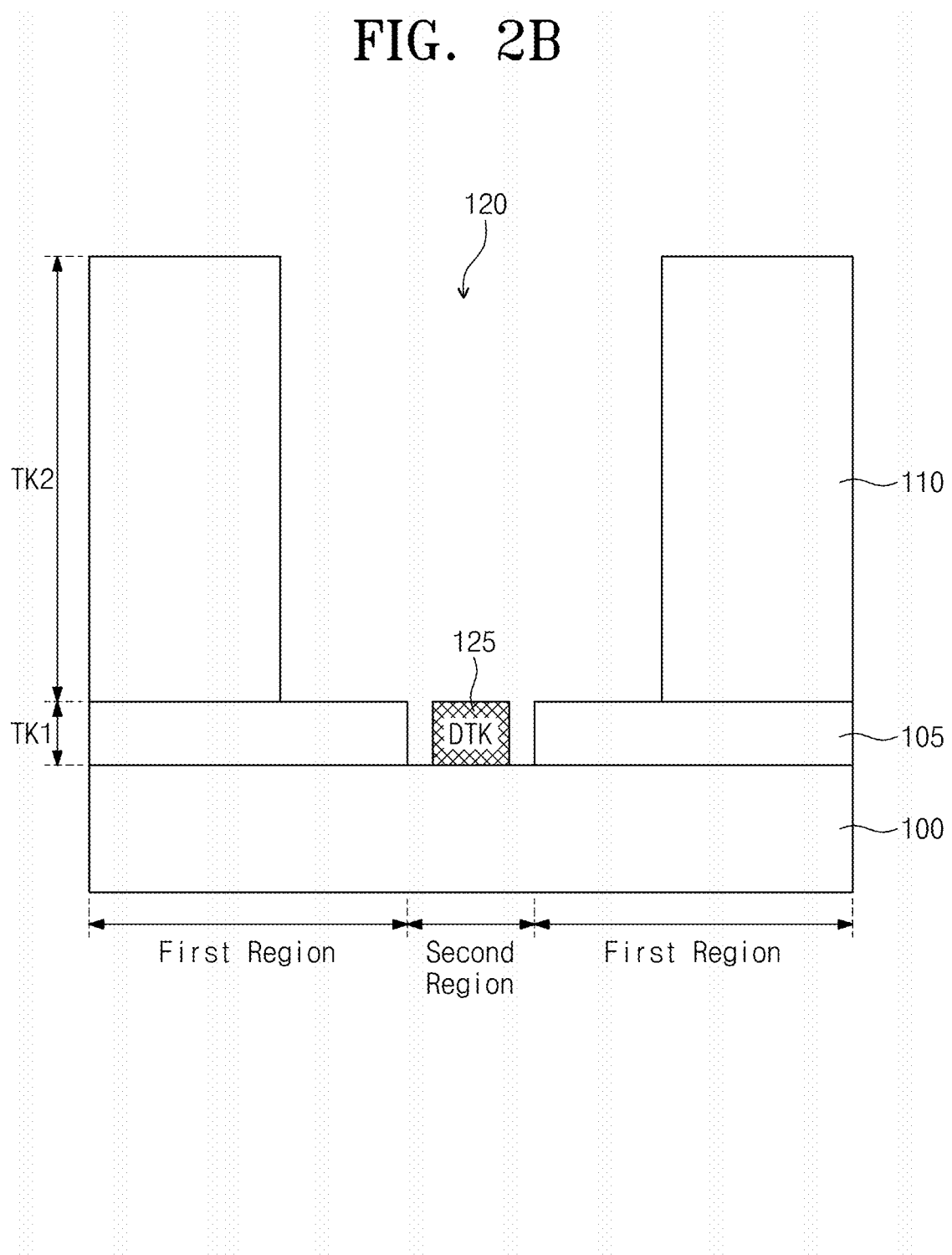

Referring to FIGS. 2A, 2B, and 2C, a dummy pattern 125 may be formed on the second region of the substrate 100 to fill at least a portion of the first opening 115.

The dummy pattern 125 may be formed in at least one (e.g., a lower one) of the two stepwise portions. The dummy pattern 125 may enable reduction of a height difference of the semiconductor device as a result of the dummy pattern at least partially filling at least one of the two stepwise portions. The dummy pattern 125 may have a thickness DTK that is substantially equal to or greater than the first thickness TK1, greater than the first thickness TK1, or smaller than the first thickness TK1.

According to some example embodiments shown in FIG. 2A, the dummy pattern 125 may be formed to completely cover or fill the first opening 115. The dummy pattern 125 may have the same or similar structure to the first opening 115. According to some example embodiments shown in FIG. 2B, the dummy pattern 125 may be formed to partially cover or fill the first opening 115. The dummy pattern 125 may have a different structure from the first opening 115. For example, the dummy pattern 125 may have a patterned structure (e.g., shaped like a contact plug) provided in the first opening 115. According to another example embodiment shown in FIG. 2C, the dummy pattern 125 may be formed to completely cover or fill the first opening 115 and partially cover a portion of the first pattern 105 adjacent to the first opening 115.

In some example embodiments, the dummy pattern 125 may be formed at the same time when the second pattern 110 is formed. In some example embodiments, the dummy pattern 125 may be formed of or include substantially the same material as the second pattern 110, such that the dummy pattern 125 and the second pattern 110 include substantially common materials.

As shown, the dummy pattern 125 may be an electrically floating structure. For example, the dummy pattern 125 may not be electrically or physically connected to any other conductive structure. Furthermore, the dummy pattern 125 may be formed of or include a conductive or insulating material.

Figure 3:
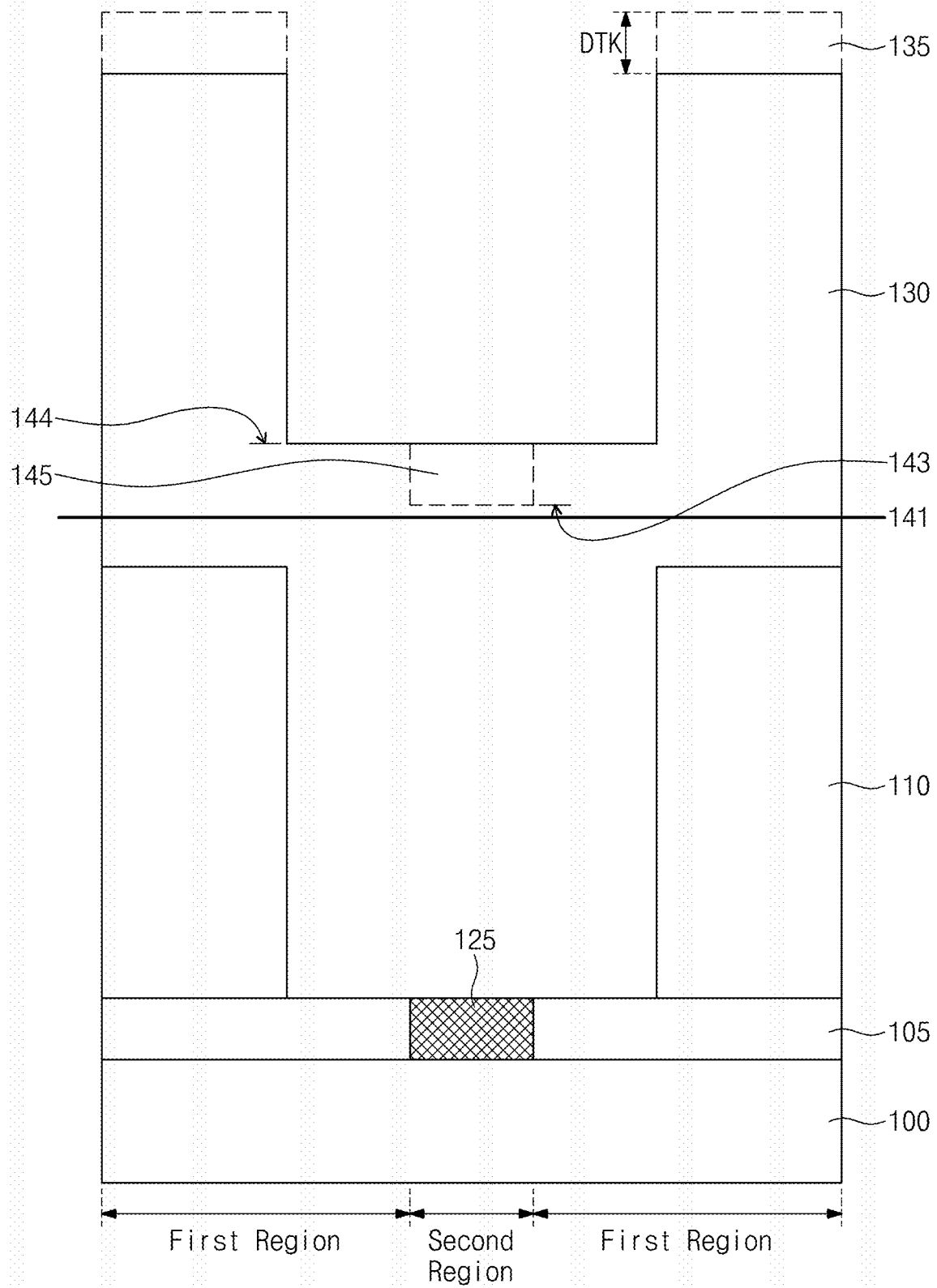
Figure 4:
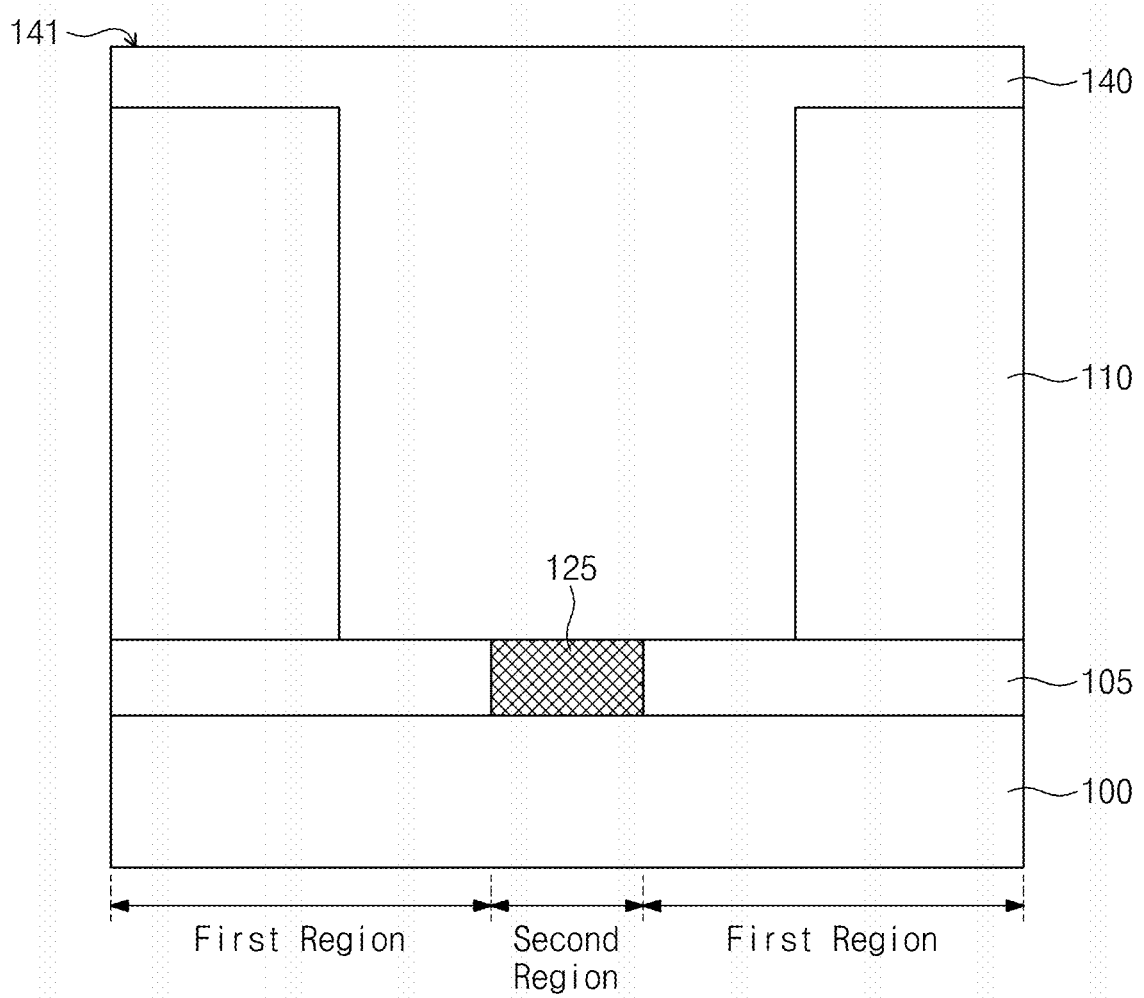

Referring to FIGS. 3 and 4, a third layer 130 may be formed on the substrate 100 to fill the second opening 120 provided with the dummy pattern 125, and an upper portion of the third layer 130 may be polished to form a third pattern 140 having a surface 141 (see FIG. 4) and covering the first and second patterns 105 and 110.

Where the dummy pattern 125 is provided, a stepwise portion 145 may be omitted from the third layer 130. A third pattern 130 including a sufficient thickness to enable the third pattern 140 (see FIG. 4) to have a desired polishing surface 141 may have a lowest surface that is greater in height than the desired polishing surface 141. Where stepwise portion 145 is omitted from the third layer 130, the lowest surface of the third layer 130 may be surface 144, rather than the lower surface 143 of the stepwise portion 145. Thus, the thickness of the third layer 130 may be reduced by a height DTK (e.g., the first thickness TK1) of the dummy pattern 125, so that the surface 144 is at the height of surface 143 above the height of the desired polishing surface 141 shown in FIG. 3. Namely, a portion 135 of the third layer 130 may be eliminated from formation. Elimination of the portion 135 from formation may result in a reduced formation of the third layer 130. A reduced formation of the third layer 130 may result in a decrease in a cost of forming the third layer 140 (see FIG. 4). In addition, because the stepwise portion 145 may be omitted from the third layer 130 as a result of the dummy pattern 125 being provided, the resulting profile of the third layer may have fewer stepwise portions. Such a reduction in stepwise portions in the profile of the third layer 130 may result in an improved thickness uniformity of the polishing process to establish a desired polishing surface 141.

In some example embodiments, where the first opening 115 is filled with the dummy pattern 125, the number ("quantity") of the stepwise portions defined between the substrate 100 and the first and second patterns 105 and 110 may be reduced, as at least one stepwise portion may be at least partially filled by the dummy pattern 125. As a result, a height that the third layer 130 is formed may be reduced, as a corresponding stepwise portion 145 in the third layer 130 may be omitted. Because the corresponding stepwise portion 145 in the third layer 130 may be omitted, as shown in FIG. 3, the height of the third layer 130 that at least uniformly reaches the target height of a polished surface 141 may be less (by thickness DTK as shown in FIG. 3) than if the stepwise portion 145 were not omitted. This may make it possible to improve thickness uniformity of the polishing process, based at least in part upon the reduced amount or portion 135 of the third layer 130 to be polished to establish a uniform surface 141, as shown in FIG. 4.

Hereinafter, a dynamic random access memory (DRAM) device will be described as an example of the semiconductor device. But example embodiments of the inventive concepts may not be limited to the example, in which the DRAM device is the semiconductor device.

FIG. 5 is a block diagram illustrating a conventional semiconductor device.

Referring to FIG. 5, a semiconductor device may include a cell region provided with memory cells and a non-cell region provided around the cell region. The non-cell region may be provided to surround the cell region and may include a core/peripheral region, which is configured to enable electrical signal transmission from/to the memory cells, and a scribe line defining a plurality of cell regions.

In some example embodiments, the scribe line may serve as a sawing line for cutting or dividing the cell regions of the semiconductor device into unit chips. Furthermore, auxiliary structures, such as a photo key, an electrical test pattern, and a measurement site, may be provided on the scribe line. The photo key may be used as, for example, a pattern for aligning it with an underlying structure, when a photolithography process is performed to form a plurality of structures on the cell regions. The electrical test pattern may be used to measure an electrical signal associated with each or some of layers of the semiconductor device, during a process of forming a plurality of structures on the cell regions. The measurement site may be used to measure physical or optical properties (e.g., a layer thickness) of each or some of the layers, in a process of forming a plurality of structures on the cell regions.

Hereinafter, a method of fabricating a semiconductor device will be exemplarily described with reference to the portion A of FIG. 5.

FIGS. 6A, 7A, 8A, 9A, 10A, 11A, 12A, 13A, and 14A are plan views illustrating a semiconductor device according to some example embodiments of the inventive concepts, and FIGS. 6B, 7B, 8B, 9B, 10B, 11B, 12B, 13B, and 14B are sectional views taken along lines I-I' of FIGS. 6A, 7A, 8A, 9A, 10A, 11A, 12A, 13A, and 14A, respectively.

Figure 6A:
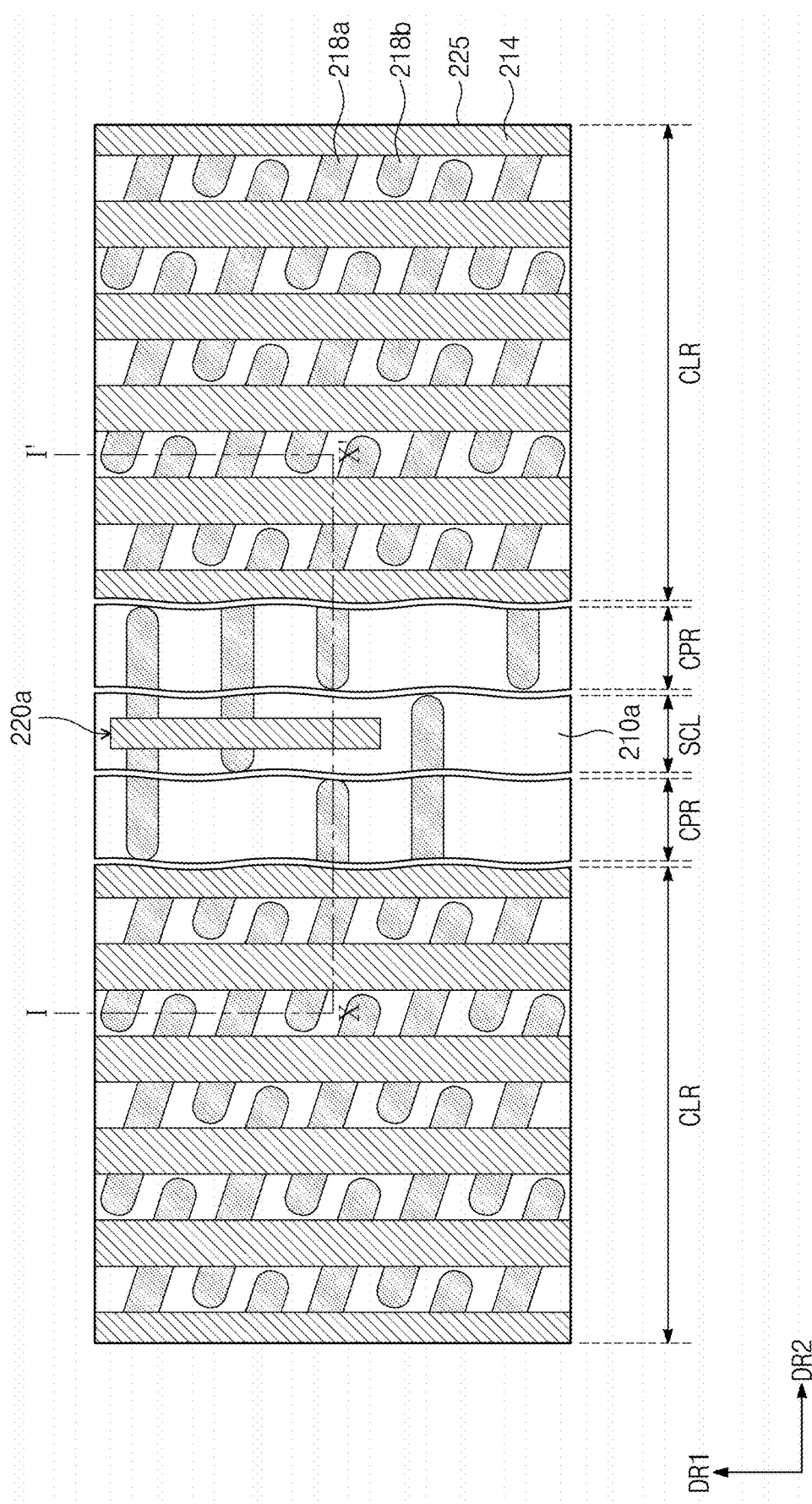
FIGS. 6A, 7A, 8A, 9A, 10A, 11A, 12A, 13A, and 14A are plan views illustrating a semiconductor device, according to some example embodiments of the inventive concepts.
Figure 6B:
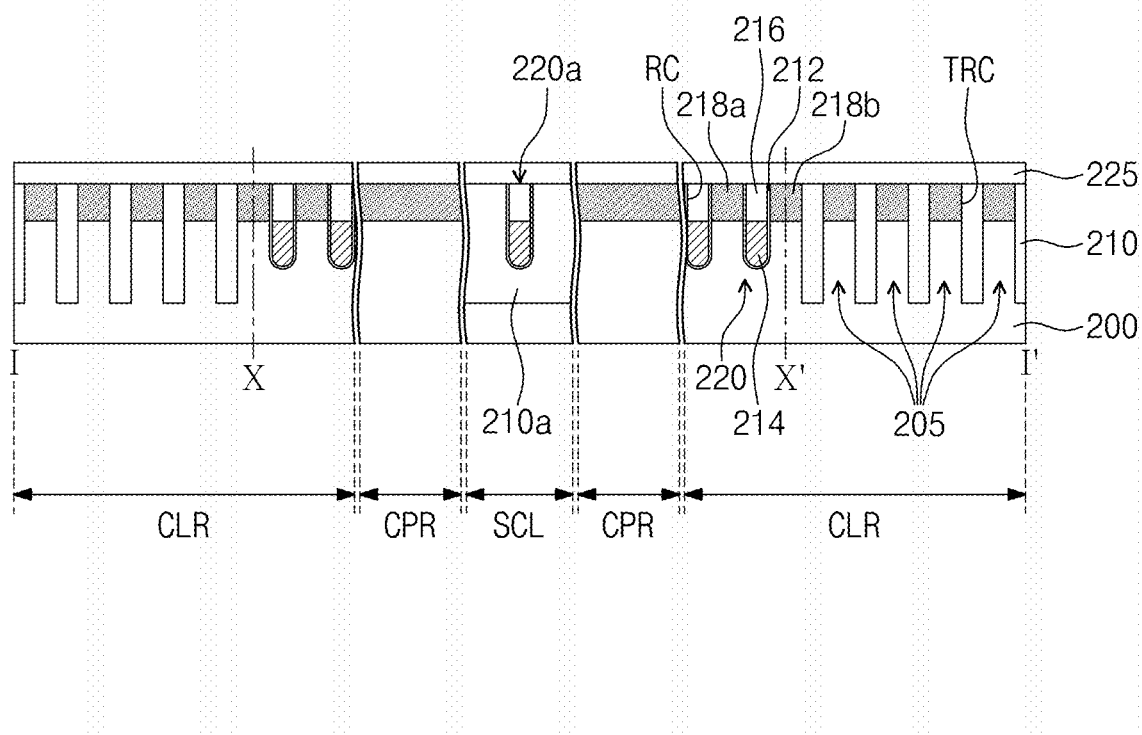
FIGS. 6B, 7B, 8B, 9B, 10B, 11B, 12B, 13B, and 14B are sectional views taken along lines I-I' of FIGS. 6A, 7A, 8A, 9A, 10A, 11A, 12A, 13A, and 14A, respectively.

Referring to FIGS. 6A and 6B, a device isolation pattern 210 may be formed on a substrate 200 including cell regions CLR and a non-cell region to define active patterns 205, and cell transistors 220 may be formed on the cell regions CLR.

In more detail, the substrate 200 may be etched to form a trench TRC, and the trench TRC may be filled with an insulating layer (e.g., of silicon oxide, silicon nitride, and silicon oxynitride) to form the device isolation pattern 210. Next, the substrate 200 may be etched to form recesses RC. The recesses RC may be formed to cross the active patterns 205 defined by the device isolation pattern 210 and may be parallel to each other. A gate insulating layer 212 may be formed in the recesses RC, and gate electrodes 214 may be formed to fill lower portions of the recesses RC provided with the gate insulating layer 212. The gate insulating layer 212 may be formed of or include at least one of silicon oxide or high-k metal oxides (e.g., hafnium oxide or aluminum oxide). The gate electrode 214 may be formed of or include at least one of doped silicon, metals (e.g., tungsten or copper), or metal compounds (e.g., titanium nitride or tungsten nitride). In addition, each of the gate electrodes 214 may extend in a first direction DR1. For example, a pair of gate electrodes 214 may be formed to cross each of the active patterns 205. First capping patterns 216 may be formed on the gate electrodes 214, respectively, to fill upper portions of the recesses RC. Each of the first capping patterns 216 may be formed of or include an insulating material (e.g., silicon oxide, silicon nitride, and silicon oxynitride). First and second impurity regions 218a and 218b may be formed in portions of the active patterns 205 exposed by each of the first capping patterns 216. The first and second impurity regions 218a and 218b may be formed via injecting impurities into the portions of the active patterns 205 exposed by each of the first capping patterns 216. The cell transistors 220 may be formed in such a way that channel regions thereof are positioned below a top surface of the substrate 200; that is, the cell transistors 220 may have a structure called a buried channel array transistor (BCAT).

Thereafter, a first interlayered insulating layer 225 may be formed on the substrate 200 to cover the cell transistor 220. The first interlayered insulating layer 225 may be formed of or include an insulating material (e.g., silicon oxide, silicon nitride, and silicon oxynitride). After the formation of the first interlayered insulating layer 225, a polishing process may be performed to polish a top surface of the first interlayered insulating layer 225.

When the cell transistors 220 and the first interlayered insulating layer 225 are formed on the cell regions CLR, a first structure 210a resembling the device isolation pattern 210 and a second structure 220a resembling the cell transistor 220 may be respectively formed in a core/peripheral region CPR and a scribe line SCL. Here, the expression "resembling" means that the first and second structures 210a and 220a include the same materials as the device isolation pattern 210 and the cell transistor 220 but are different from the device isolation pattern 210 and the cell transistor 220 in terms of their structures or positions. Although a detailed description will be omitted, the first and second structures 210a and 220a may have a variety of structures. The first and second structures 210a and 220a may not be formed in the core/peripheral region CPR and the scribe line SCL or may be formed in a portion thereof.

Figure 7A:
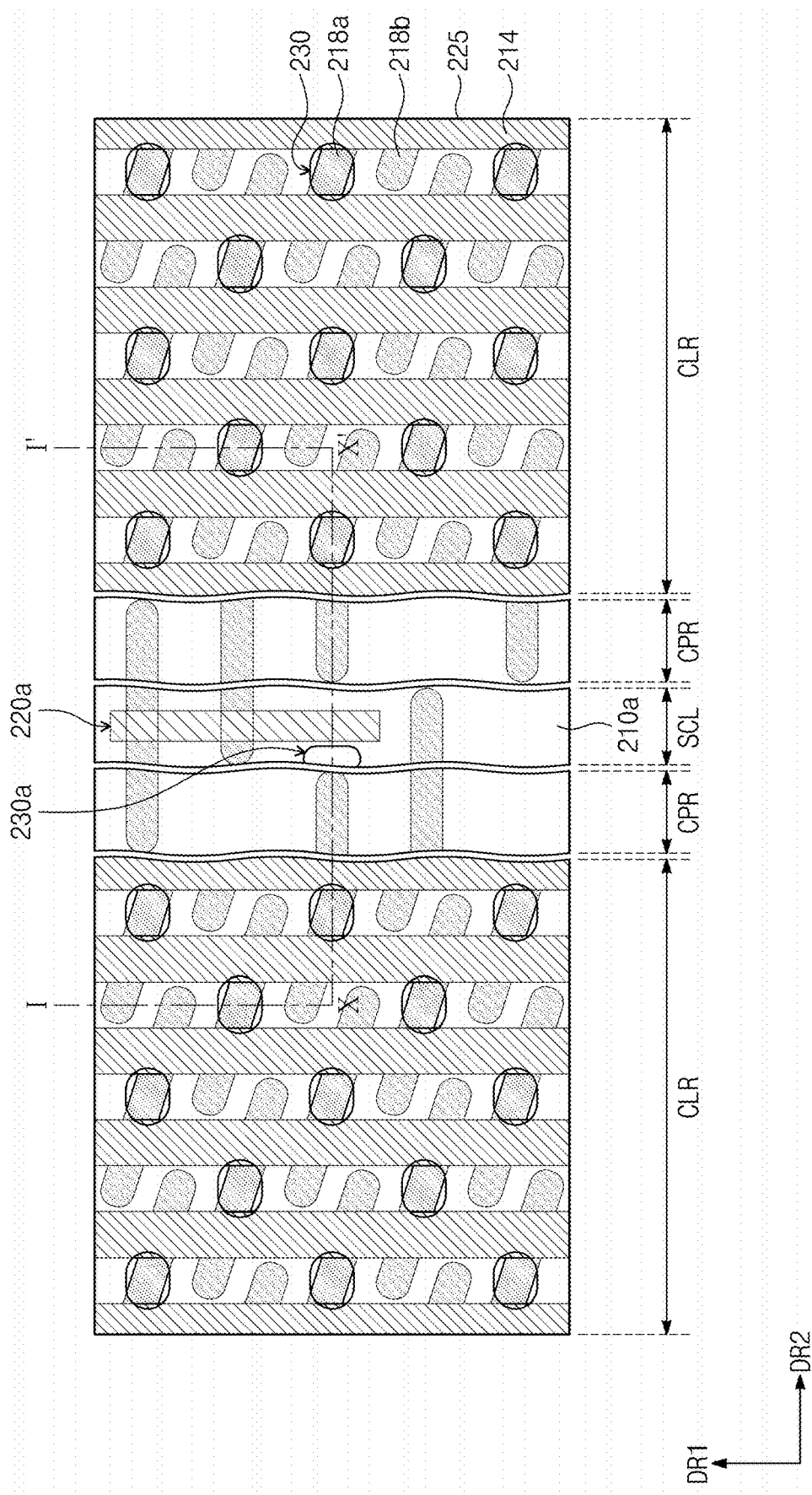
Figure 7B:
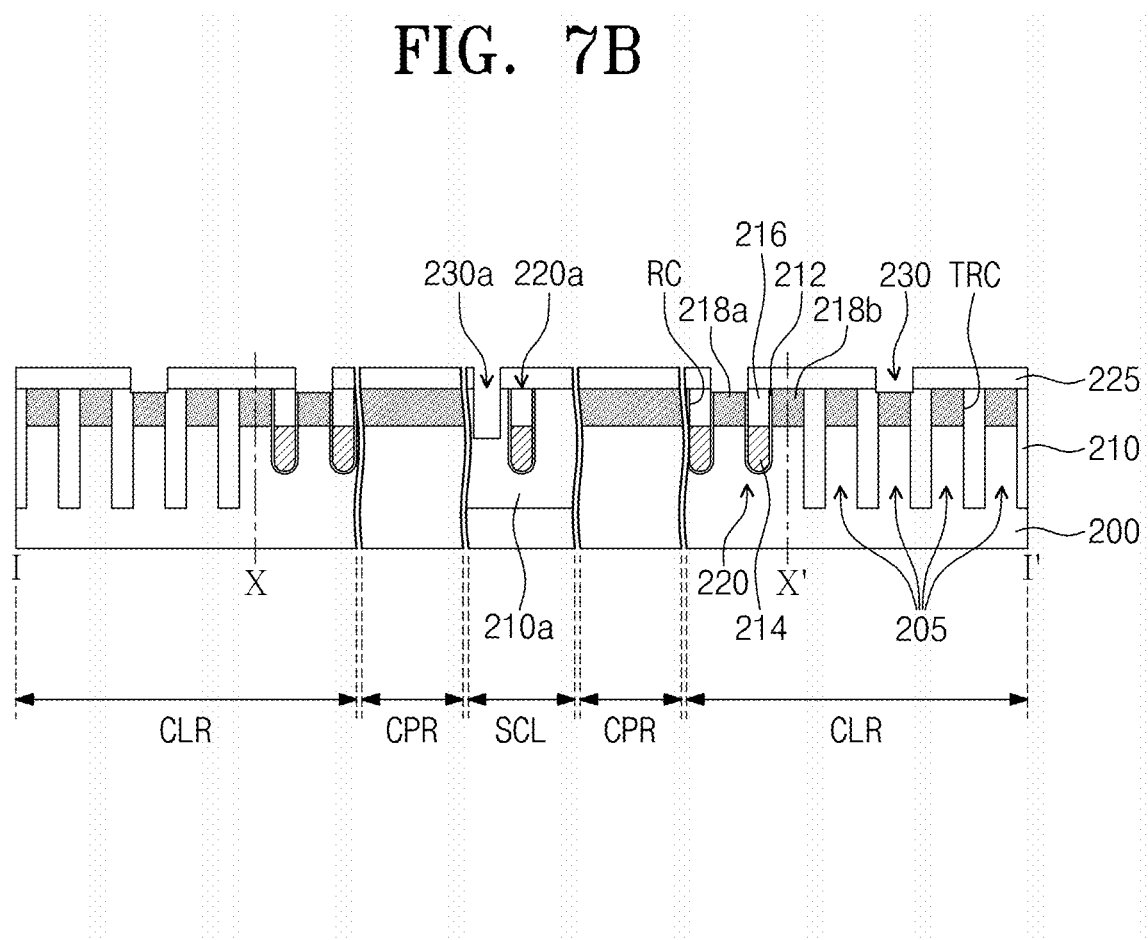

Referring to FIGS. 7A and 7B, the first interlayered insulating layer 225 may be patterned to form first contact holes 230 exposing the first impurity regions 218a, respectively.

In some example embodiments, when a photolithography process using a mask (not shown) is performed to form the first contact holes 230 on the cell region CLR, the photo key formed on the scribe line SCL (e.g., see FIG. 5) may be opened or exposed before the photolithography process, so as to allow the mask to be aligned with the photo key. The first and second structures 210a and 220a may be exposed when the photo key on the scribe line SCL is opened. For example, in the case where the first interlayered insulating layer 225 includes oxide and the first structure 210a resembling the device isolation pattern 210 includes a material (e.g., oxide) similar to that of the device isolation pattern 210, an exposed portion of the first structure 210a may be etched in the process of forming the first contact hole 230, and as a result, the first opening 230a may be formed on the scribe line SCL.

As shown in FIGS. 7A and 7B, the first opening 230a may be formed to have a hole-shaped structure, but in some example embodiments, when viewed in plan view, the first opening 230a may have a line-shaped or patterned structure extending in a specific direction or various structures (e.g., circular, elliptical, or polygonal structures).

In some example embodiments, the first opening 230a on the scribe line SCL may be formed during the photolithography process, but in some example embodiments, the first opening 230a may be formed when the auxiliary structures (e.g., electrical test patterns or measurement sites) for testing the structures of FIGS. 7A and 7B are exposed. Furthermore, the first opening 230a may be formed on not only the scribe line SCL but also the core/peripheral region CPR.

Figure 8A:
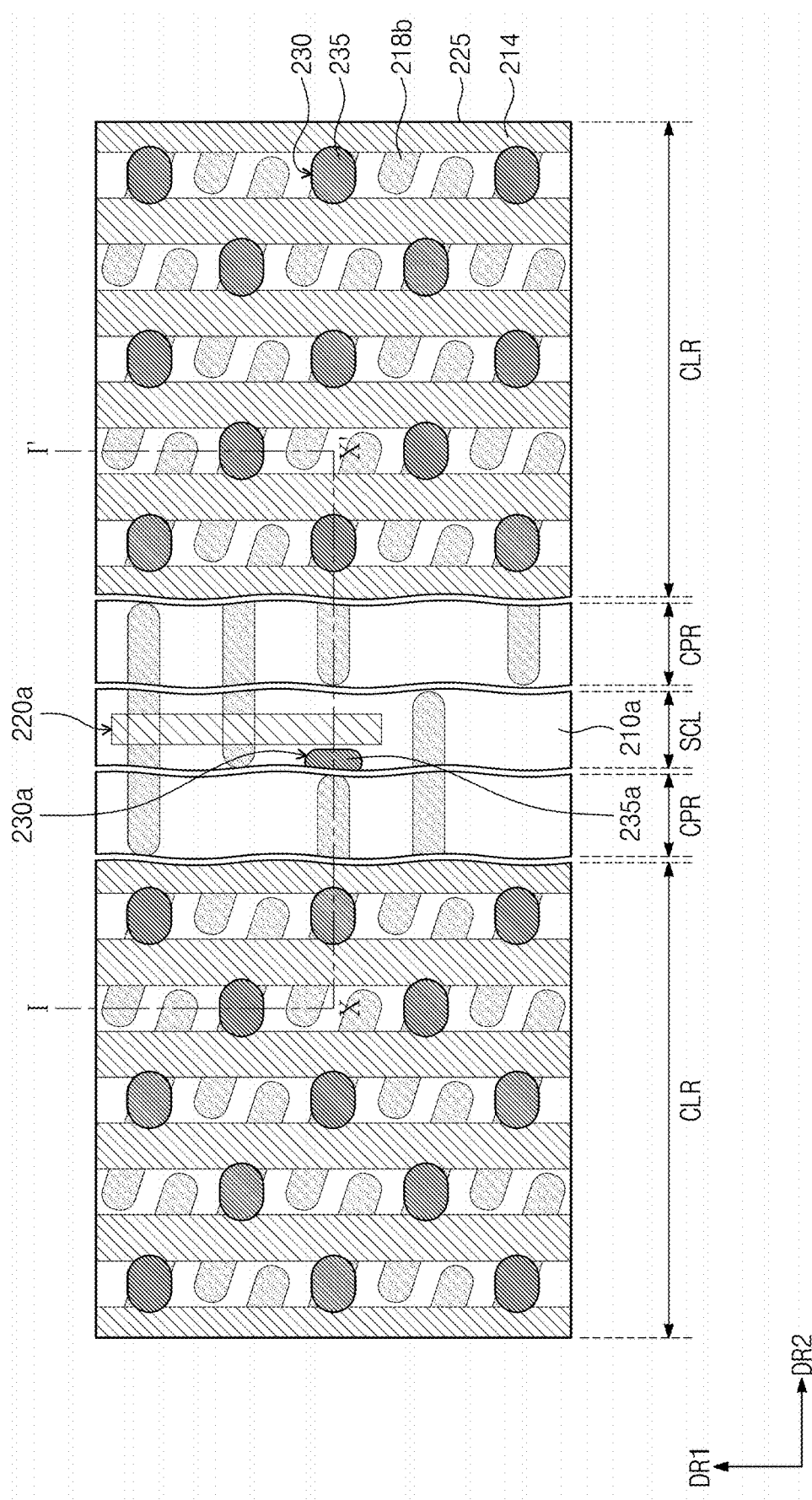
Figure 8B:
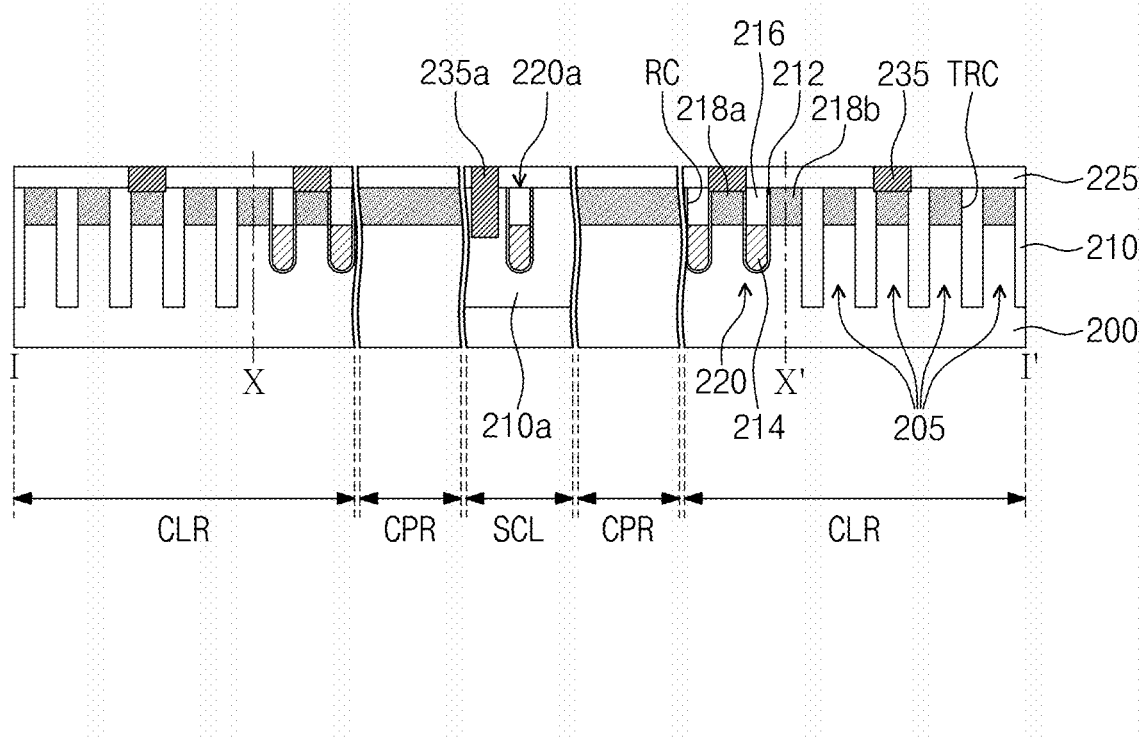

Referring to FIGS. 8A and 8B, the first contact holes 230 may be filled with a first conductive material to form first contact plugs 235 electrically coupled to the first impurity regions 218a. The first conductive material may include at least one of doped silicon, metals (e.g., tungsten or copper), or metal compounds (e.g., titanium nitride or tungsten nitride).

In some example embodiments, when the first contact holes 230 are filled with the first conductive material, the first opening 230a may also be filled with the first conductive material to form a first dummy pattern 235a. The first dummy pattern 235a may be in an electrically floating state. In other words, the first dummy pattern 235a may be electrically and physically isolated from any other conductive structure. When the first dummy pattern 235a is electrically or physically connected to other structure, the other structure may be in an electrically floating state.

In some example embodiments, at least a portion of the first opening 230a may be filled with the first conductive material and may have an empty structure.

According to some example embodiments, the first dummy pattern 235a may be formed to completely fill the first opening 230a and have the same structure as the first opening 230a. According to some example embodiments, the first dummy pattern 235a may be formed to partially cover or fill the first opening 230a to have a structure smaller than or different from the first opening 230a. For example, the first dummy pattern 235a may have a patterned structure or a contact plug structure. According to some example embodiments, the first dummy pattern 235a may be formed to cover or fill the first opening 230a and to partially cover the first interlayered insulating layer 225, and thus, the first dummy pattern 235a may have a structure greater than or different from the first opening 230a.

Figure 9A:
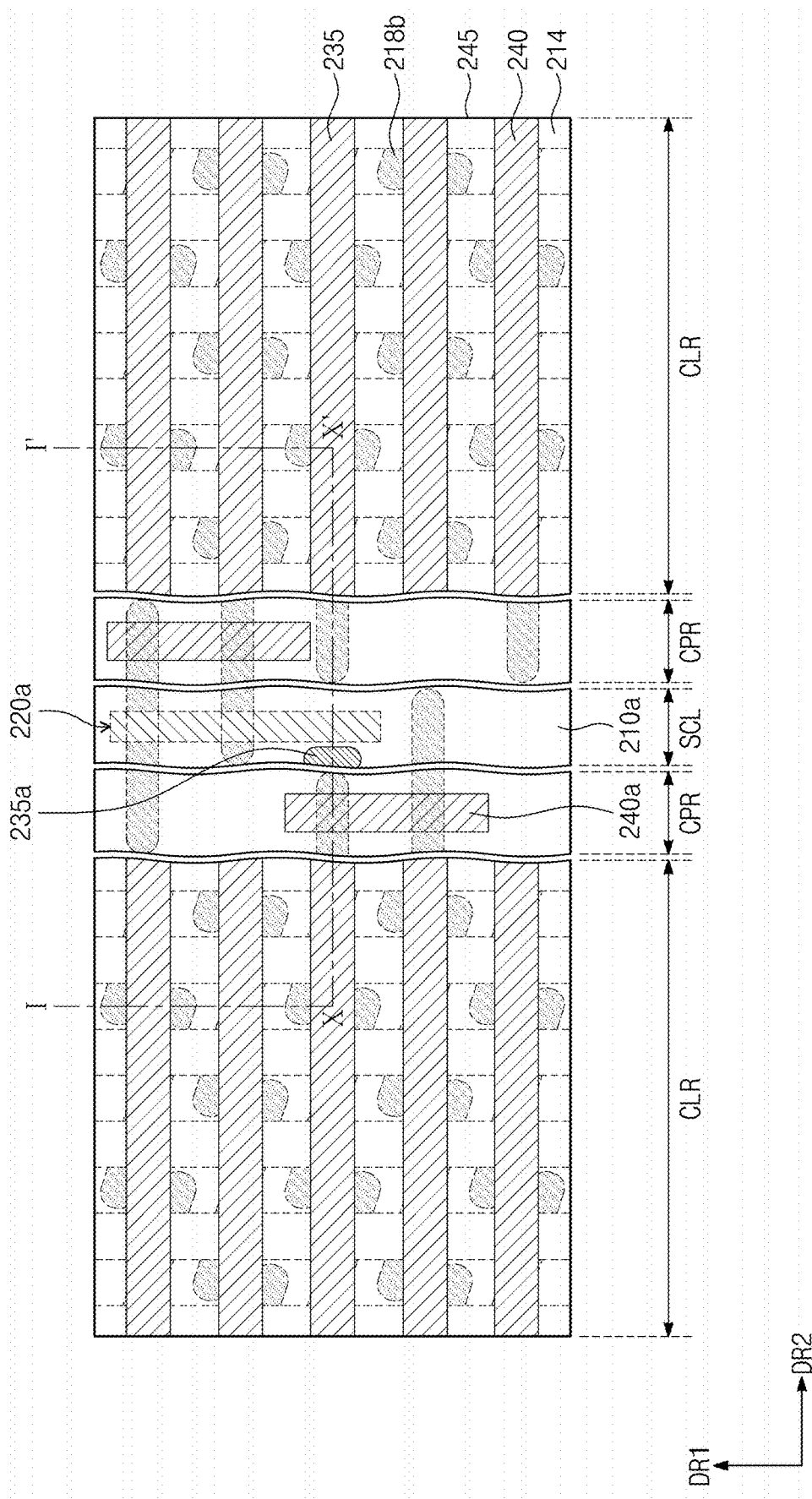
Figure 9B:
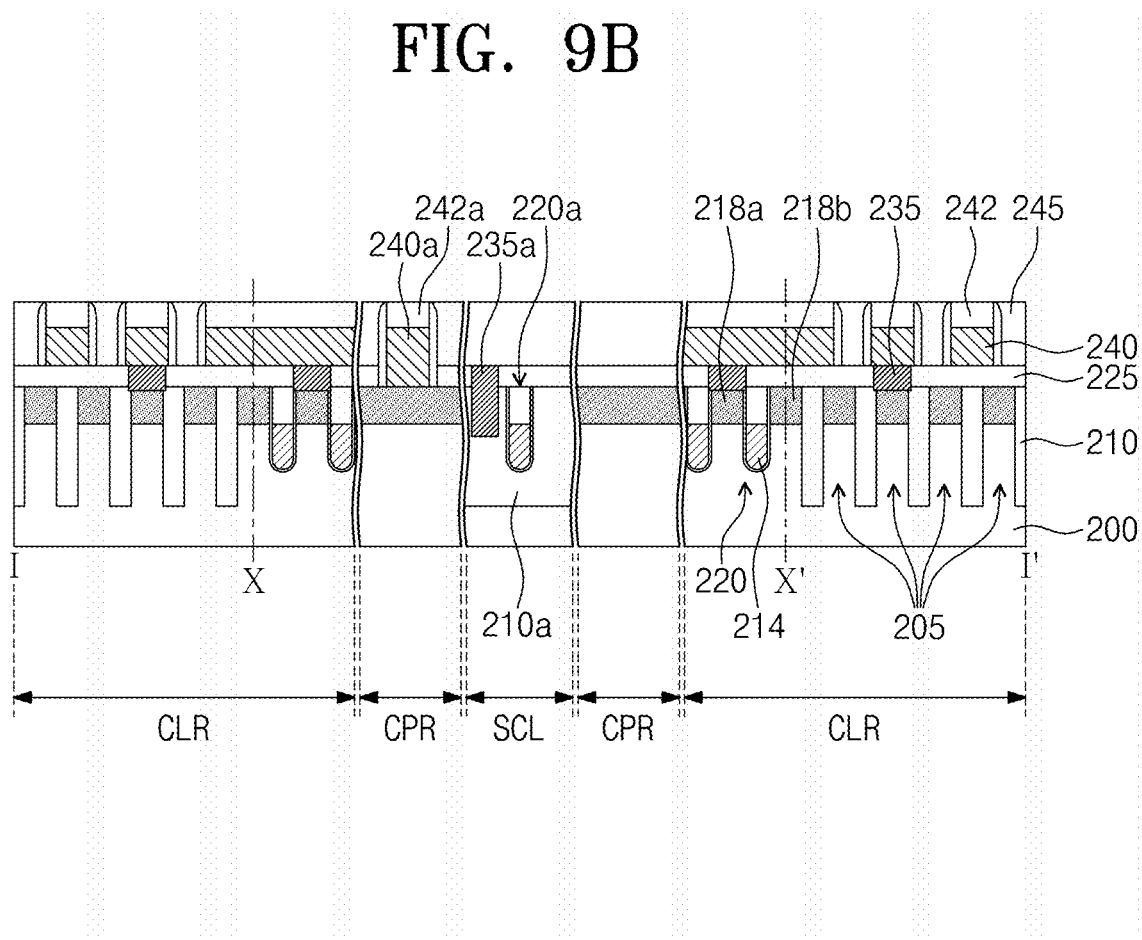

Referring to FIGS. 9A and 9B, bit line structures electrically coupled to the first contact plugs 235 may be formed on the cell regions CLR and a core/peripheral gate electrode structure may be formed on the core/peripheral region CPR. The bit line structures may electrically couple the first contact plugs 235 to each other.

In more detail, a first conductive layer (not shown) and a mask layer (not shown) may be sequentially formed on the first interlayered insulating layer 225. The first conductive layer may be formed of or include at least one of doped silicon, metals (e.g., tungsten or copper), or metal compounds (e.g., titanium nitride or tungsten nitride). In the case where the first opening 230a is not filled with the first conductive material of the first contact plug 235, the first conductive layer may be formed to fill the first opening 230a, and thus, the first dummy pattern 235a may be formed in the first opening 230a. The first dummy pattern 235a may be in an electrically floating state. The first dummy pattern 235a may be formed to have the same structure as that described with reference to FIGS. 8A and 8B, and in order to avoid redundancy, a detailed explanation of the first dummy pattern 235a is omitted.

Next, the first mask layer and the first conductive layer may be patterned by a photolithography process using a mask, to form the bit line structure and the core/peripheral gate electrode structure. Here, the bit line structure may include second capping patterns 242 and bit lines 240, and the core/peripheral gate electrode structure may include a core/peripheral capping pattern 242a and a core/peripheral gate electrode 240a.

As shown in FIG. 9A, the bit lines 240 may be formed parallel to a second direction DR2 perpendicular to the first direction DR1 and may be parallel to each other, on the cell regions CLR. In some example embodiments, the gate electrode structure and the bit line structures are formed on the core/peripheral region CPR and the cell regions CLR, respectively, but a structure corresponding to the gate electrode structure or the bit line structure may not be formed on the scribe line SCL.

A second interlayered insulating layer 245 may be formed on the substrate 200 to cover the bit line structure, the core/peripheral gate electrode structure, and the scribe line SCL. The second interlayered insulating layer 245 may be formed of or include an insulating material (e.g., silicon oxide, silicon nitride, and silicon oxynitride).

Figure 10A:
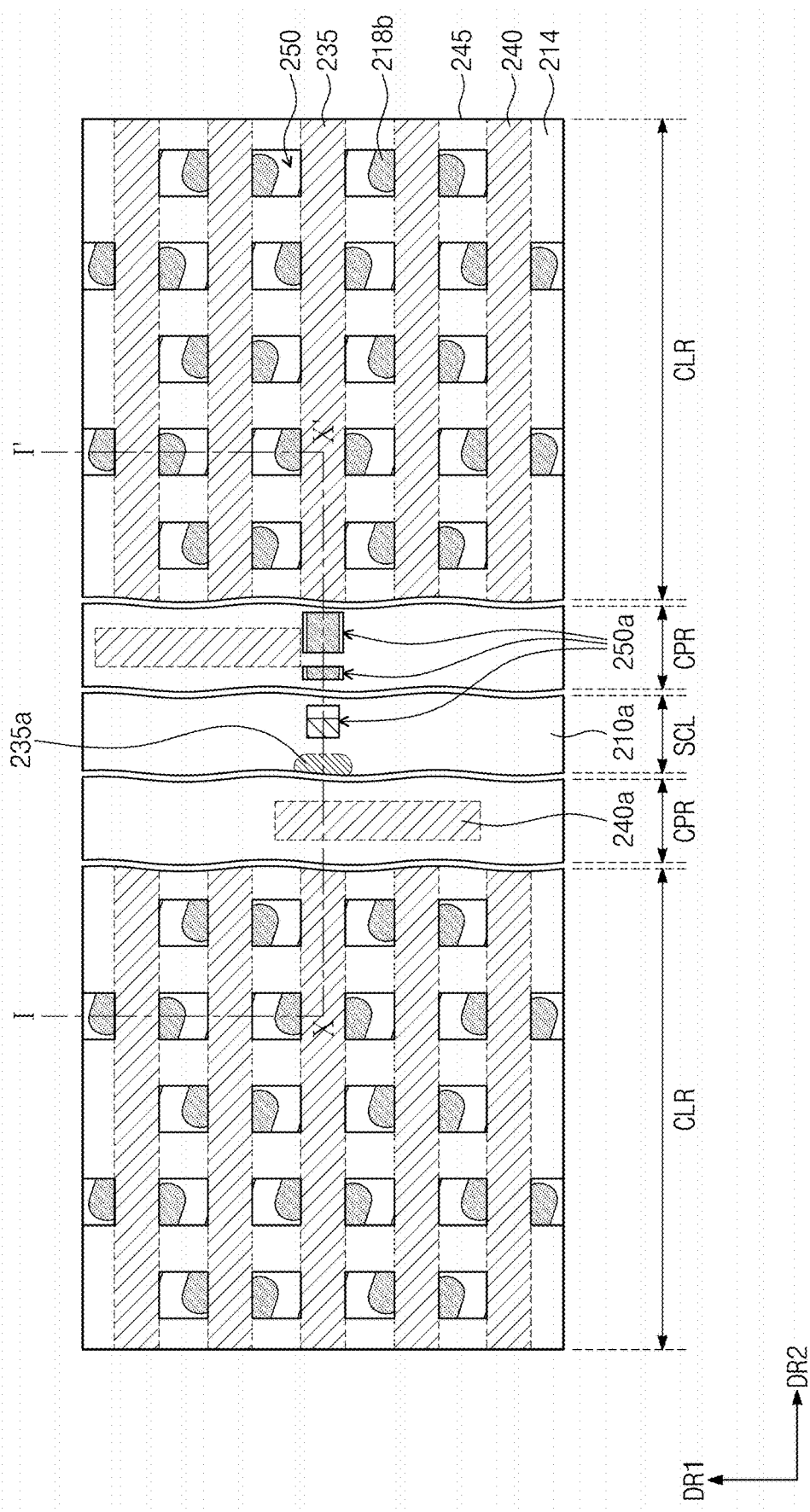
Figure 10B:
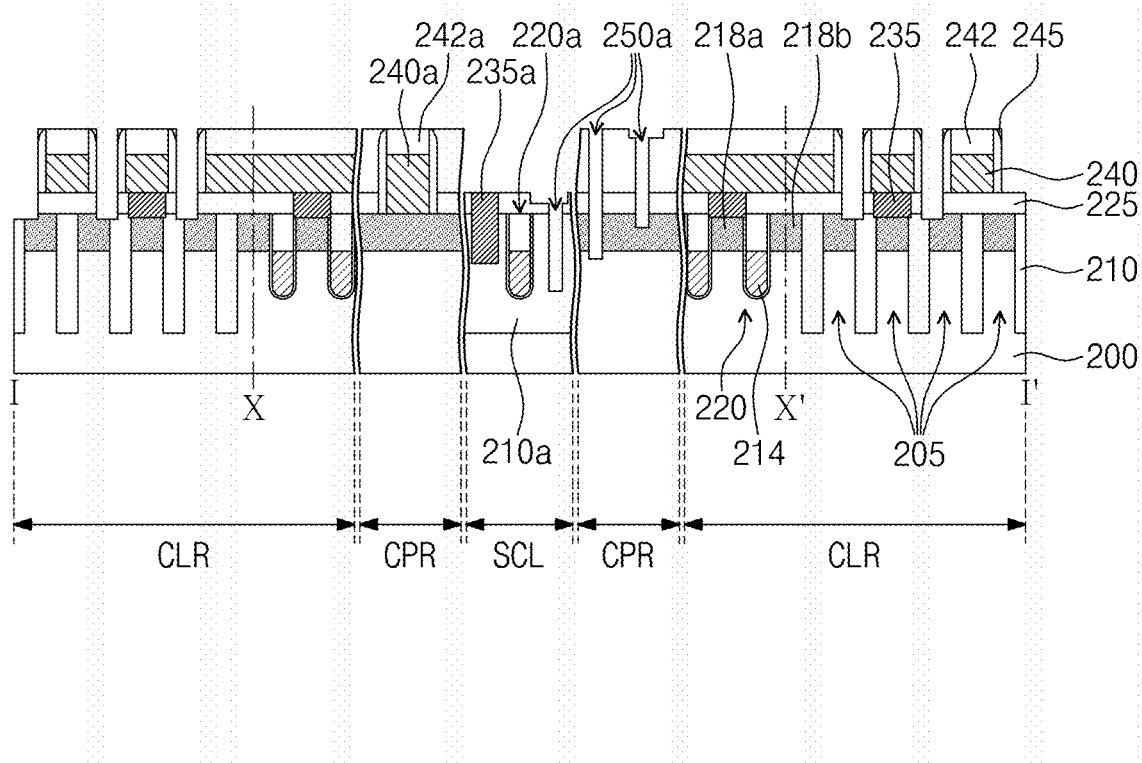

Referring to FIGS. 10A and 10B, the second interlayered insulating layer 245 and the first interlayered insulating layer 225 may be patterned to form second contact holes 250 exposing the second impurity regions 218b, respectively. The second contact holes 250 may be formed on the cell region CLR.

In some example embodiments, when a photolithography process using a mask (not shown) is performed to form the second contact holes 250 on the cell region CLR, the photo key formed on the scribe line SCL (e.g., see FIG. 5) may be opened or exposed before the photolithography process, so as to allow the mask to be aligned with the photo key. The first and second structures 210a and 220a on the scribe line SCL and the core/peripheral region CPR may be exposed, when the photo key on the scribe line SCL is opened. For example, in the case where the second interlayered insulating layer 245 includes oxide and the first structure 210a resembling the device isolation pattern 210 includes a material (e.g., oxide) similar to that of the device isolation pattern 210, an exposed portion of the first structure 210a may be etched in the process of forming the second contact hole 250, and as a result, the second openings 250a may be formed on the scribe line SCL and the core/peripheral region CPR. The second openings 250a may have a variety of differing sectional shapes.

As shown in FIGS. 10A and 10B, each of the second openings 250a may be formed to have a hole-shaped structure, but in some example embodiments, when viewed in a plan view, each of the second openings 250a may have a line-shaped structure extending in a specific direction or various structures (e.g., circular, elliptical, or polygonal structures).

In some example embodiments, the second openings 250a on the scribe line SCL and the core/peripheral region CPR may be formed during the photolithography process, but in some example embodiments, the second openings 250a may be formed when the auxiliary structures (e.g., electrical test patterns or measurement sites) for testing the structures of FIGS. 10A and 10B are exposed.

Figure 11A:
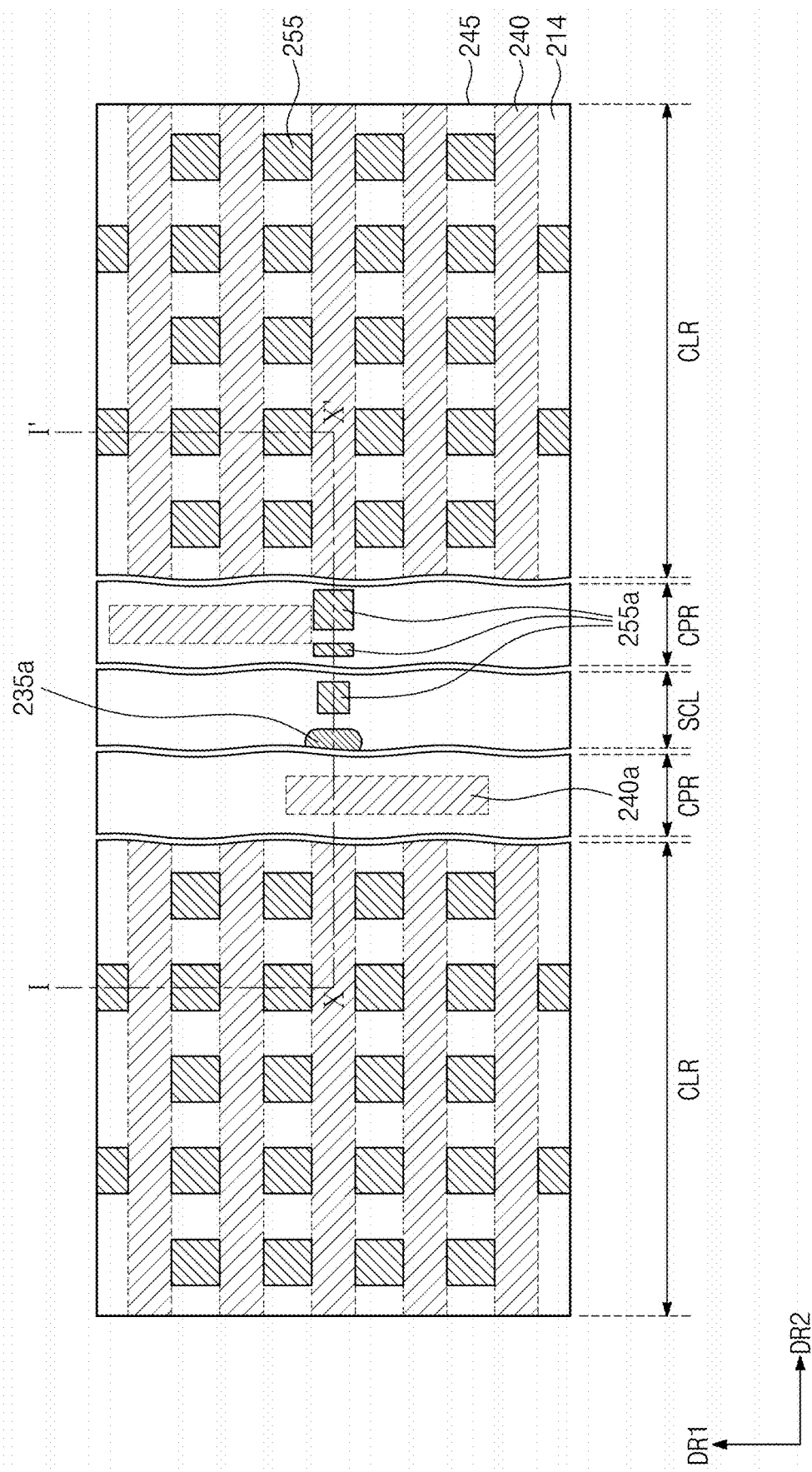
Figure 11B:
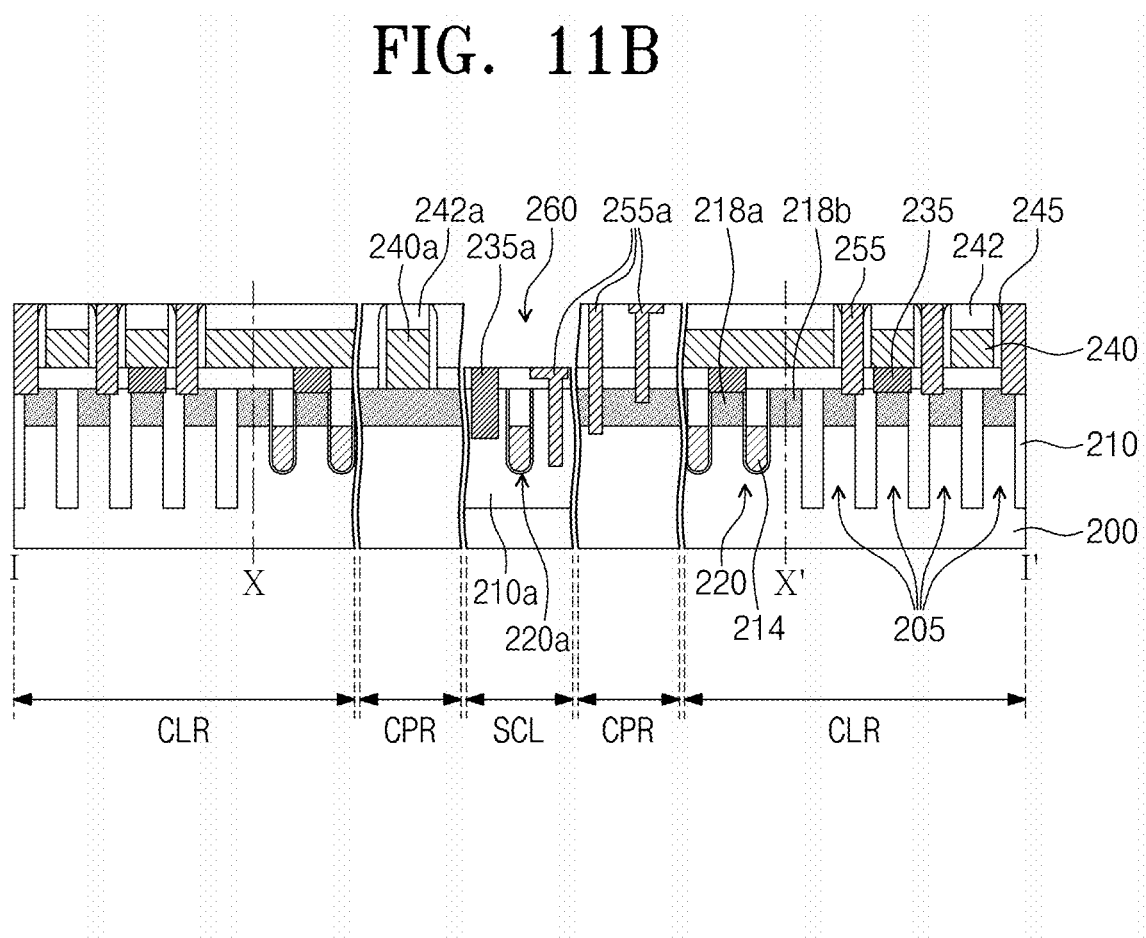

Referring to FIGS. 11A and 11B, the second contact holes 250 may be filled with a second conductive material to form second contact plugs 255 electrically coupled to the second impurity regions 218b. The second conductive material may be formed of or include at least one of doped silicon, metals (e.g., tungsten or copper), or metal compounds (e.g., titanium nitride or tungsten nitride).

In some example embodiments, when the second contact holes 250 are filled with the second conductive material, the second opening 250a may also be filled with the second conductive material to form a second dummy pattern 255a. The second dummy pattern 255a may be in an electrically floating state. The second dummy pattern 255a may be, for example, a pillar-shaped structure penetrating the first and second interlayered insulating layers 225 and 245. Alternatively, the second dummy pattern 255a may include a pillar portion penetrating the first and second interlayered insulating layers 225 and 245 and a cover portion connected to the pillar portion. In this case, the second dummy pattern 255a may have a "T"-shaped section.

According to some example embodiments, the second dummy pattern 255a may be formed to completely fill the second opening 250a and have substantially the same structure as the second opening 250a. According to some example embodiments, the second dummy pattern 255a may be formed to partially cover or fill the second opening 250a to have a structure smaller than or different from the second opening 250a. According to some example embodiments, the second dummy pattern 255a may be formed to cover or fill the second opening 250a and to partially cover the first interlayered insulating layer 225, and thus, the second dummy pattern 255a may have a structure greater than or different from the second opening 250a.

Figure 12A:
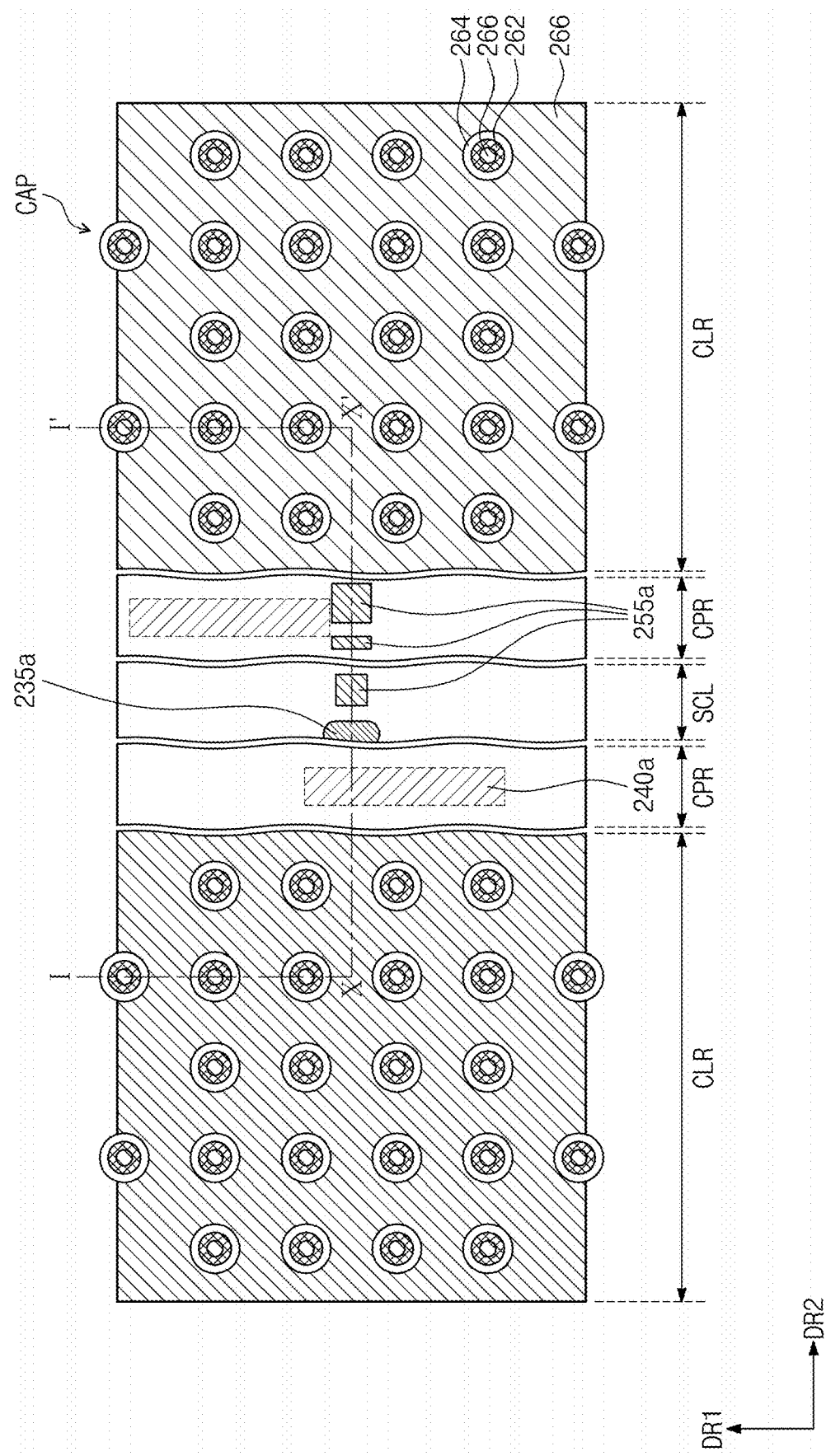
Figure 12B:
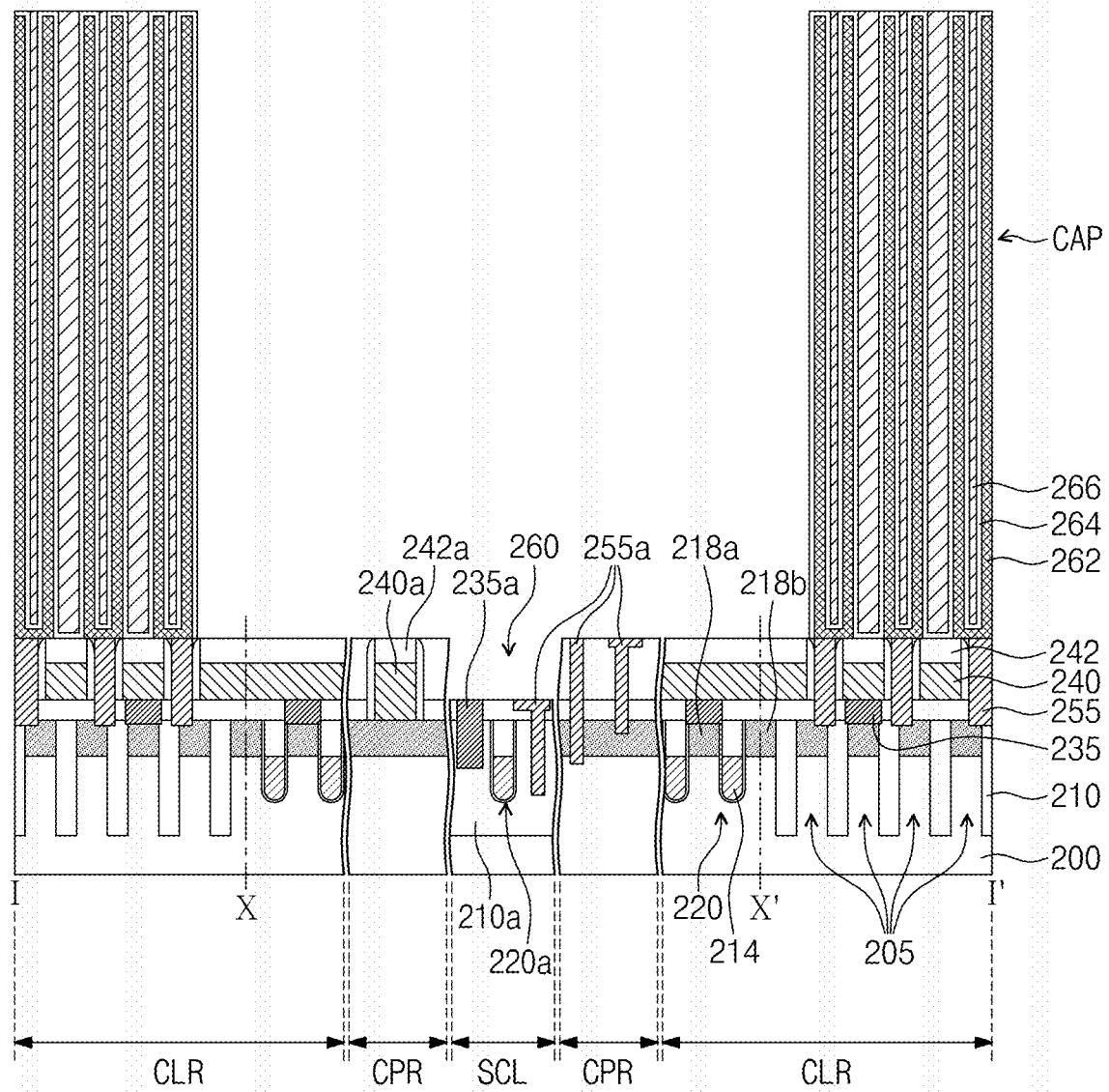

Referring to FIGS. 12A and 12B, capacitors CAP may be connected to the second contact plugs 255, respectively. The capacitors CAP may be formed on the cell region CLR.

In more detail, a third interlayered insulating layer (not shown) may be formed to cover the second contact plugs 255, and the third interlayered insulating layer may be etched to form holes (not shown) exposing the second contact plugs 255, respectively. A first electrode layer (not shown) may be conformally formed on the third interlayered insulating layer provided with the holes. The first electrode layer may be formed in such a way that the holes are not completely filled therewith. The holes provided with the first electrode layer may be filled with a sacrificial layer (not shown). The sacrificial layer and the first electrode layer may be etched to expose a top surface of the third interlayered insulating layer, and thus, first electrodes 262 having a cylinder shape may be formed in the holes. After the formation of the first electrodes 262, the sacrificial layer and the third interlayered insulating layer may be removed. In some example embodiments, supporter rings (not shown) may be additionally formed to prevent the first electrodes 262 having a high aspect ratio from being leaned or fallen.

A dielectric layer 264 may be formed to conformally cover inner and outer sidewalls of the first electrodes 262. Second electrodes 266 may be formed to fill spaces in or out of the first electrodes 262 provided with the dielectric layer 264. Here, each of the capacitors CAP may include the first electrode 262, the dielectric layer 264, and the second electrode 266.

Figure 13A:
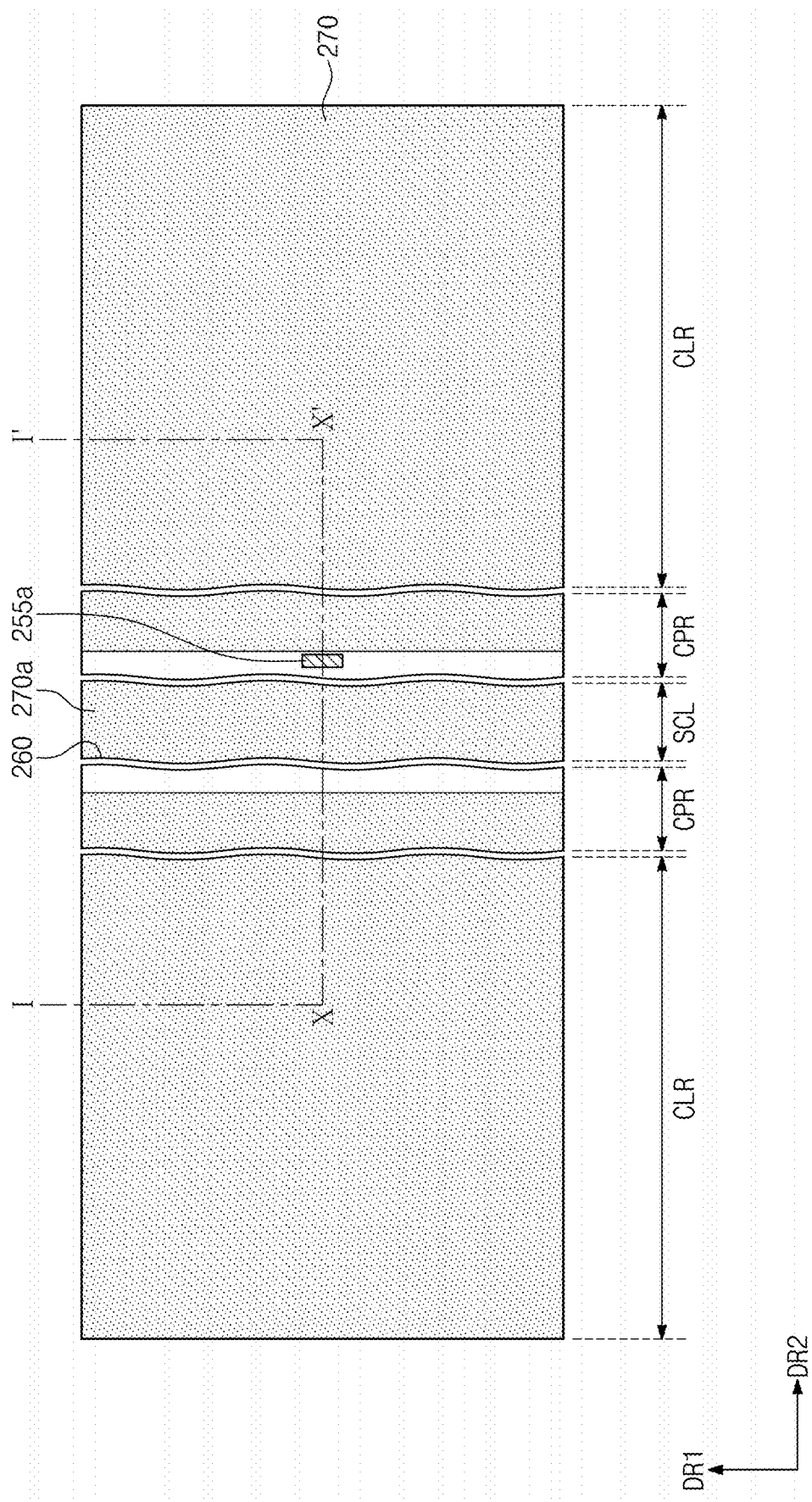
Figure 13B:
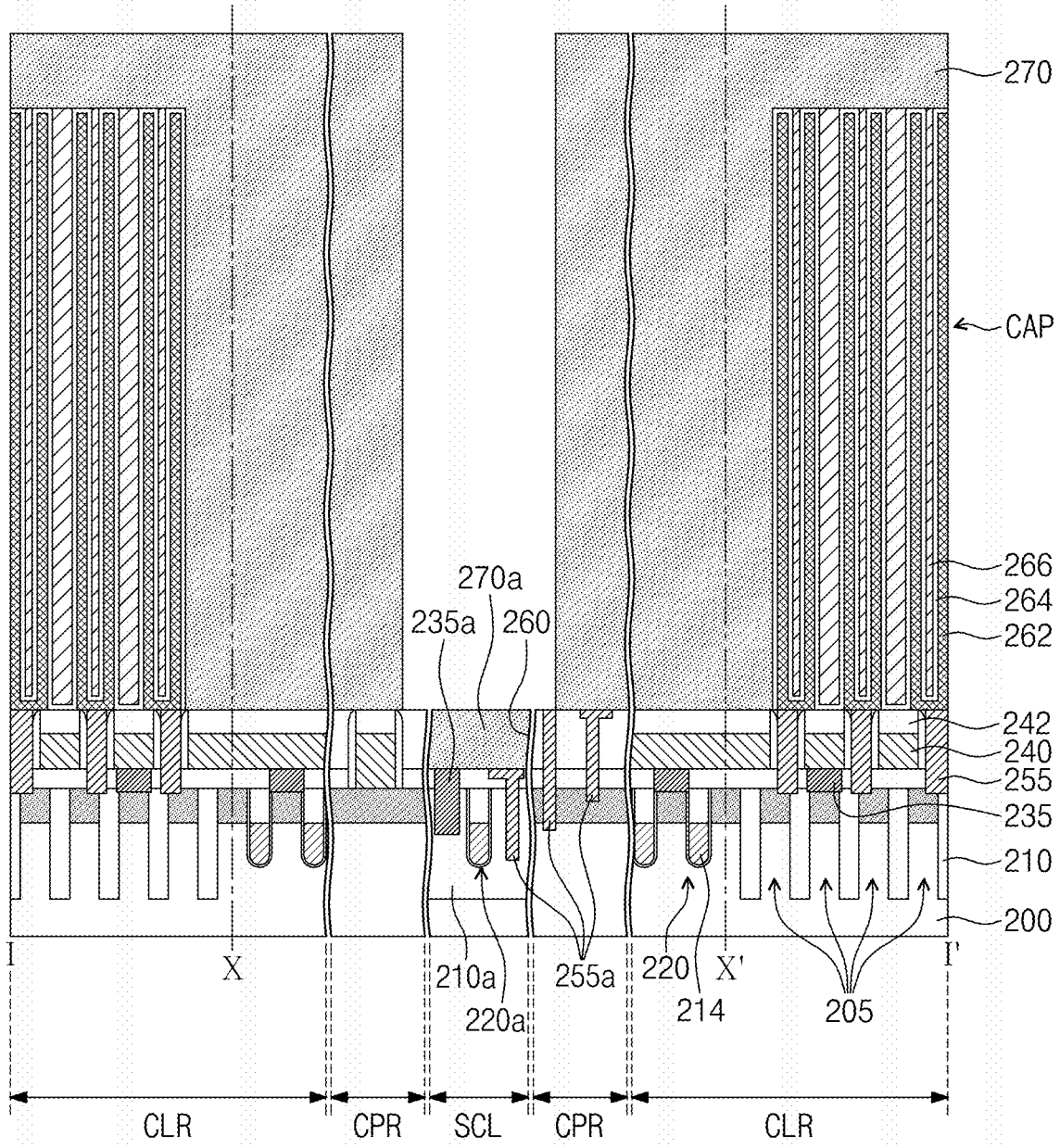

Referring to FIGS. 13A and 13B, a plate electrode layer 270 may be formed to connect the second electrodes 266 of the capacitors CAP to each other. The plate electrode layer 270 may be formed of or include silicon germanium.

Since a structure corresponding to the bit line structure or the core/peripheral gate electrode structure is not formed on the scribe line SCL (e.g., see FIGS. 9A and 9B), a stepwise region 260 at a level different from the cell region CLR and the core/peripheral region CPR may be formed on the scribe line SCL. The stepwise region 260 may have a line-shaped structure extending in the first direction DR1. The stepwise region 260 may be filled with the plate electrode layer 270 to form a third dummy pattern 270a. The third dummy pattern 270a may be in an electrically floating state.

According to some example embodiments, the third dummy pattern 270a may be formed to completely fill the stepwise region 260 and have substantially the same structure as the stepwise region 260. According to some example embodiments, the third dummy pattern 270a may be formed to partially cover or fill the stepwise region 260 to have a structure smaller than or different from the stepwise region 260. According to some example embodiments, the third dummy pattern 270a may be formed to cover the stepwise region 260 and have an upward-protruding structure.

Figure 14A:
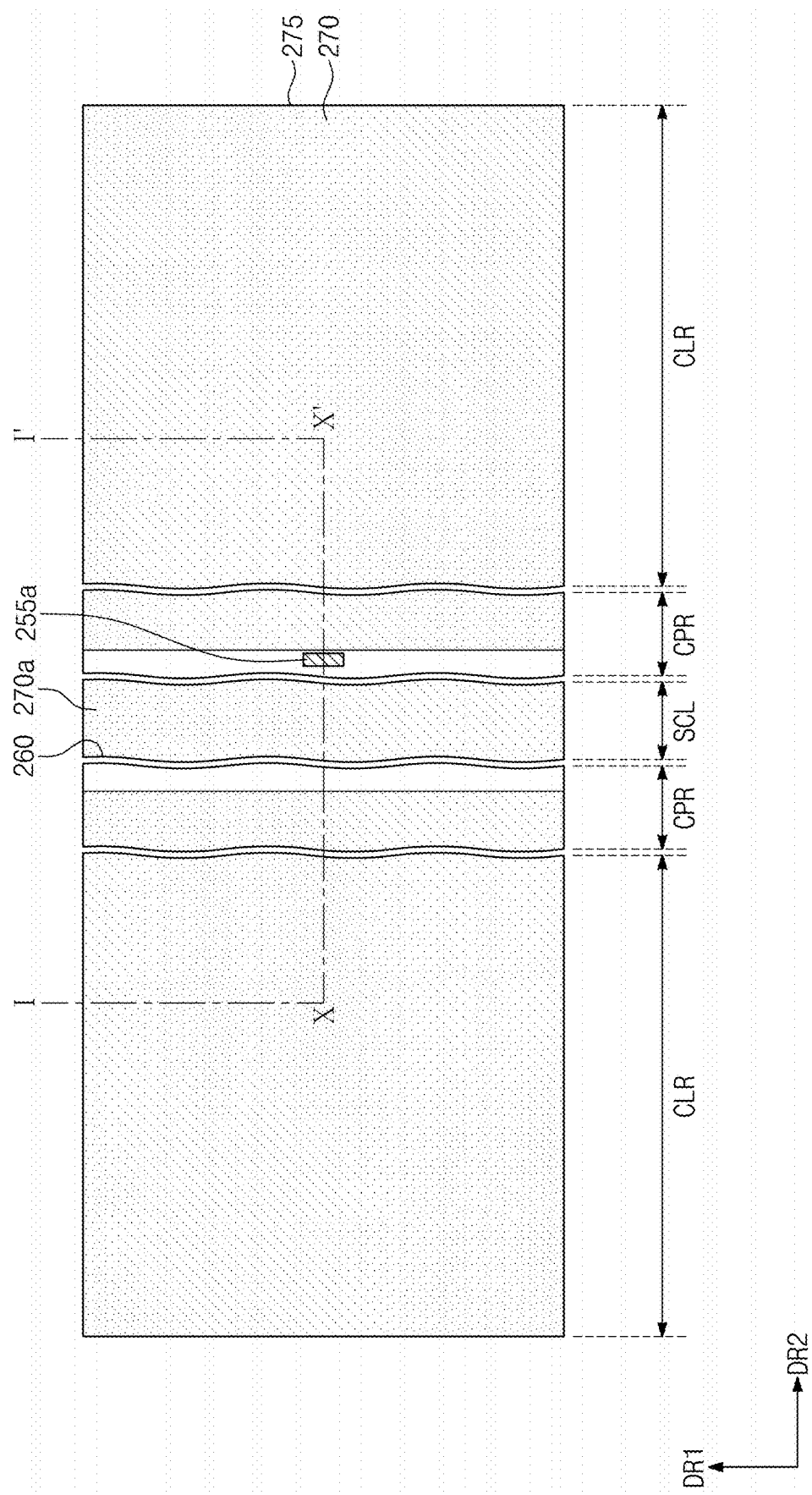
Figure 14B:
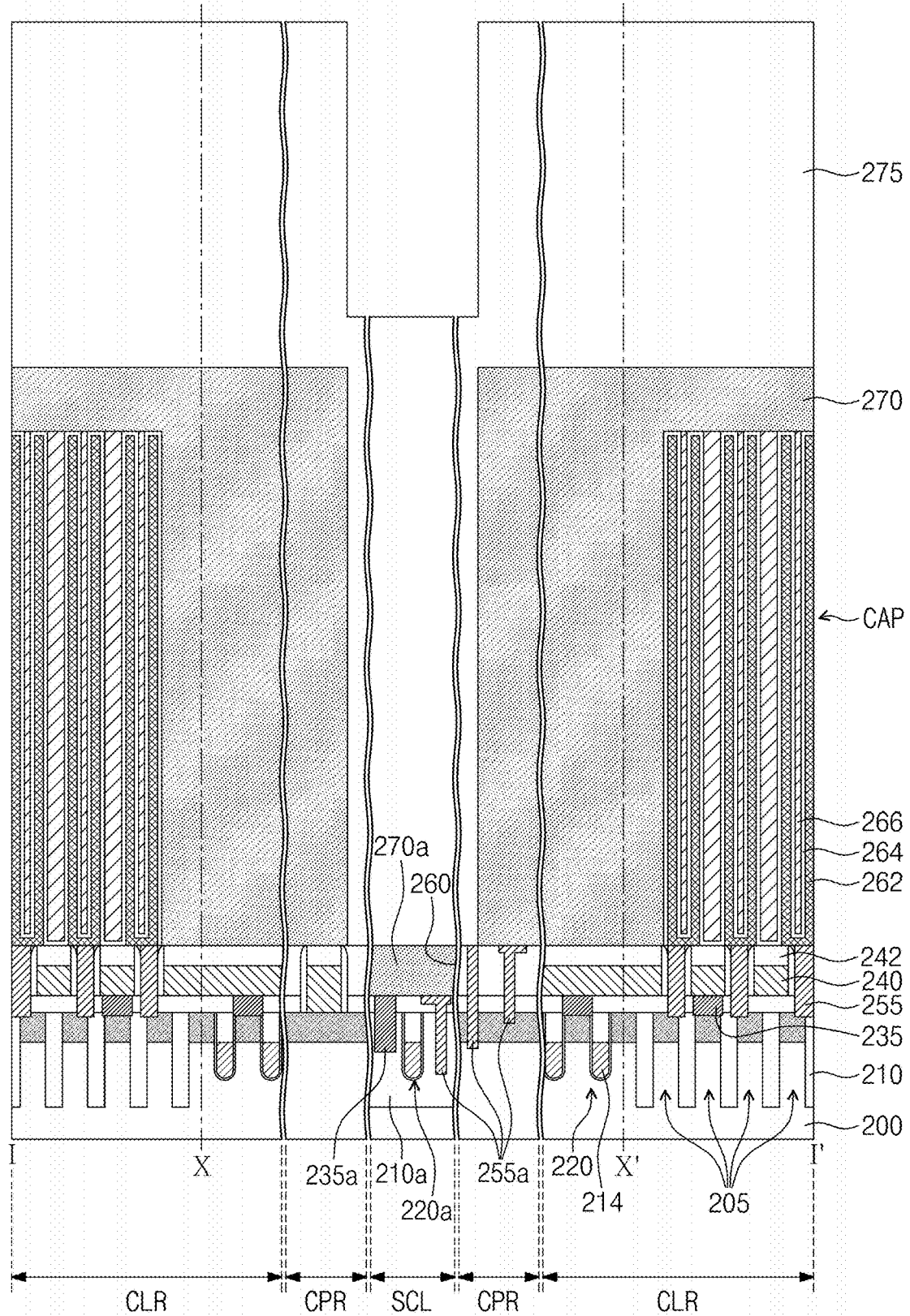

Referring to FIGS. 14A and 14B, a fourth interlayered insulating layer 275 may be formed on the substrate 200 provided with the plate electrode layer 270. Thereafter, a polishing process may be performed to polish a top surface of the fourth interlayered insulating layer 275.

As described above, the capacitors CAP and the bit lines 240 may be formed on the cell region CLR but not on the scribe line SCL, and thus, the stepwise region 260 with a very large depth may be formed between the cell region CLR and the scribe line SCL. In the present embodiment, the third dummy pattern 270a may be formed between the bit lines 240 (i.e., on the scribe line SCL), and this may reduce a height difference of the stepwise region 260 between the cell region CLR and the scribe line SCL and between the core/peripheral region and the scribe line SCL.

Accordingly, a thickness of the fourth interlayered insulating layer 275 may be reduced by a height of the third dummy pattern 270a, and this makes it possible for the fabrication process to be performed with lower cost and higher productivity. Furthermore, it is possible to improve uniformity in thickness of the fourth interlayered insulating layer 275, on which the polishing process is performed.

Figure 15:
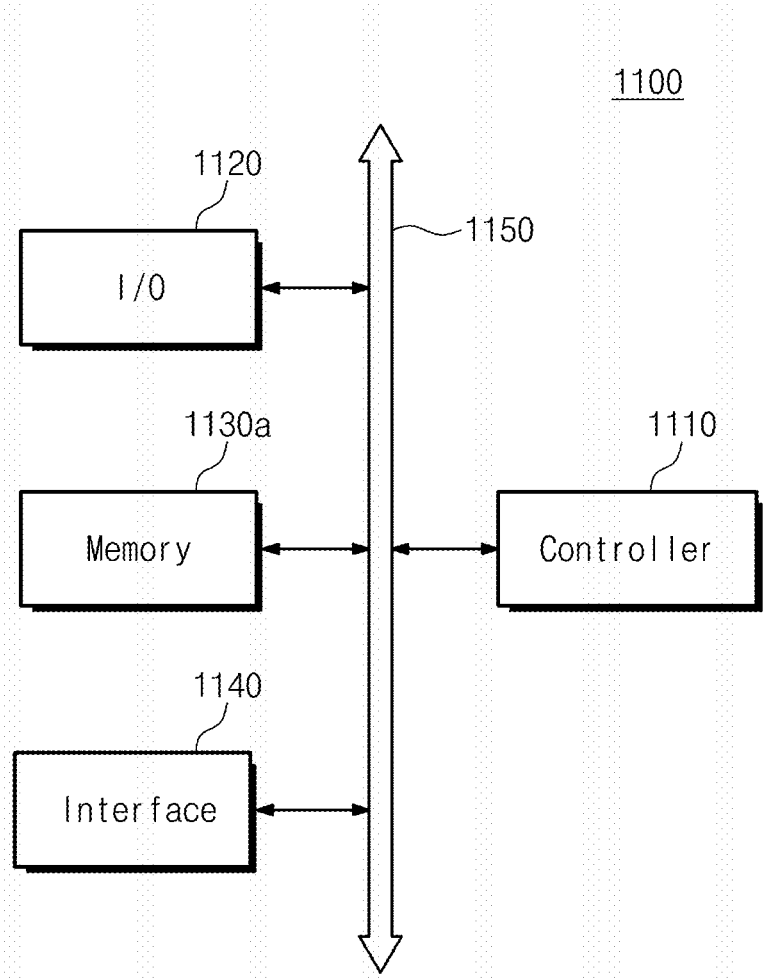
FIG. 15 is a schematic block diagram illustrating an example of electronic systems including a semiconductor device, according to some example embodiments of the inventive concepts.

FIG. 15 is a schematic block diagram illustrating an example of electronic systems including a semiconductor device according to some example embodiments of the inventive concepts.

Referring to FIG. 15, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may include a semiconductor device according to some example embodiments of the inventive concepts.

The controller 1110 may include, e.g., at least one of a microprocessor, a digital signal processor, a microcontroller, or another logic device, which is configured to have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate in a wireless or wireless manner. For example, the interface unit 1140 may include an antenna for wireless communication or a wireless transceiver for wireless communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or an electronic product, which is configured to receive or transmit information data wirelessly.

Figure 16:
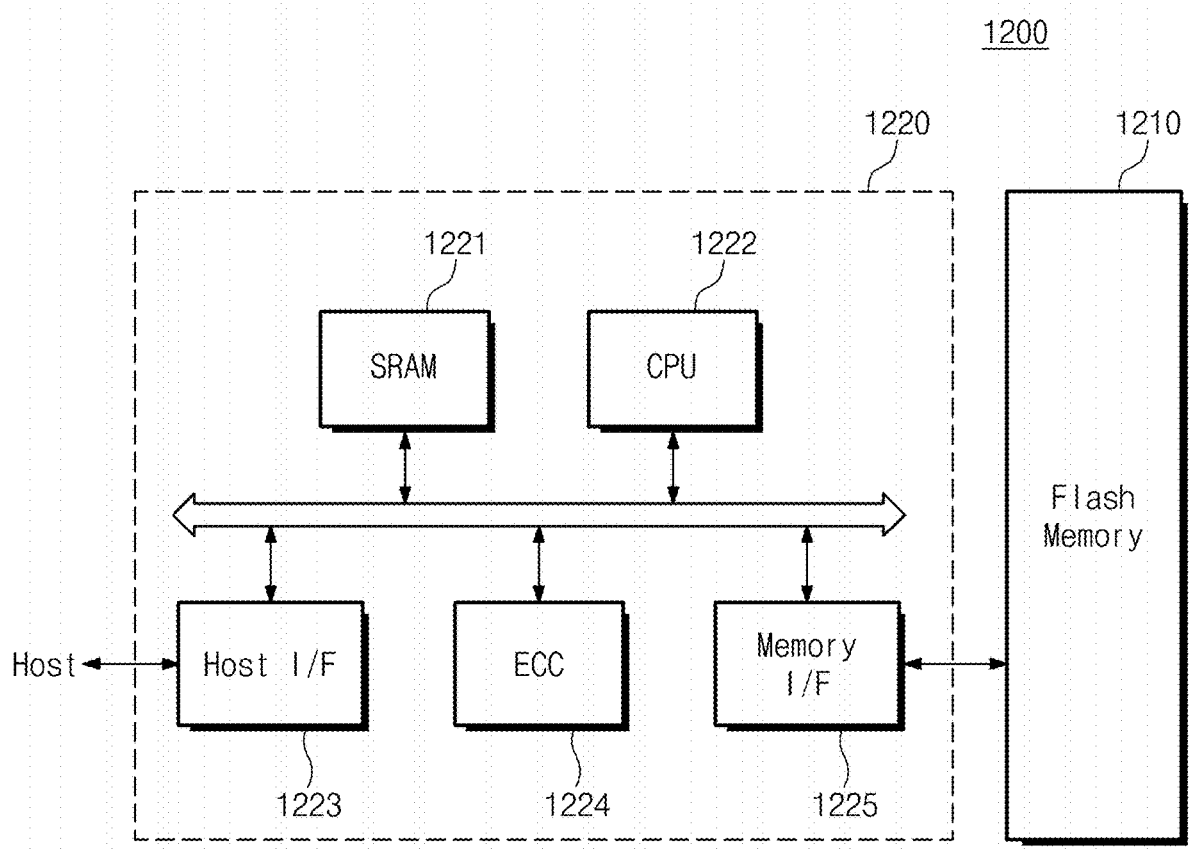
FIG. 16 is a schematic block diagram illustrating an example of memory cards including a semiconductor device, according to some example embodiments of the inventive concepts.

FIG. 16 is a schematic block diagram illustrating an example of memory cards including a semiconductor device according to some example embodiments of the inventive concepts.

Referring to FIG. 16, at least one semiconductor memory device 1210 according to some example embodiments of the inventive concepts may be used in a memory card 1200 with a large memory capacity. The memory card 1200 may include a memory controller 1220 configured to control a data exchange operation between a host and the semiconductor memory device 1210.

A static random access memory (SRAM) 1221 may be used as an operation memory of a processing unit 1222. A host interface 1223 may include data exchange protocols of a host to be connected to the memory card 1200. An error correction block 1224 may be configured to detect and correct errors included in data readout from a multi bit semiconductor memory device 1210. A memory interface 1225 may be configured to interface with the semiconductor memory device 1210. The processing unit 1222 may perform every control operation for exchanging data of the memory controller 1220. Even though not depicted in drawings, it is apparent to one of ordinary skill in the art that the memory card 1200 according to some example embodiments of the inventive concepts may further include a ROM (not shown) storing code data for interfacing with the host.

According to some example embodiments of the inventive concepts, a dummy pattern may be formed in or on a stepwise region, which may result from a structure provided on cell regions and a non-cell region, or in or on an opening, which may be formed on the non-cell region, and the dummy pattern may make it possible to reduce a height difference between the cell regions and the non-cell region. Accordingly, it is possible to reduce a deposition thickness of a layer, which will be deposited in a subsequent process, and thereby to reduce cost of a fabrication process. Furthermore, it is possible to improve uniformity in thickness of the polished layer.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a semiconductor substrate including a first region and a second region;
   a dielectric structure provided on the semiconductor substrate at the second region, the dielectric structure having a recessed region;
   a capacitor structure on the first region; and
   a dummy pattern in the recessed region,
   wherein the capacitor structure includes
      a first electrode provided on the semiconductor substrate,
      a dielectric layer covering the first electrode, and
      a second electrode provided on the dielectric layer, and wherein the dummy pattern is formed of a same material as at least one of the first electrode, the dielectric layer and the second electrode.

2. The semiconductor device of claim 1, wherein the first region is a cell region and the second region is a scribe line region or core/peripheral region.

3. The semiconductor device of claim 1, further comprising:
a third electrode interposed between the second electrode and the dielectric layer,
wherein the dummy pattern is formed of a same material as at least one of the first electrode, the dielectric layer, the third electrode and the second electrode.

4. The semiconductor device of claim 1, further comprising:
a channel region positioned below a top surface of the semiconductor substrate at the first region.

5. The semiconductor device of claim 1, further comprising:
a word line buried in the semiconductor substrate at the first region; and
a buried structure buried in the semiconductor substrate at the second region.

6. The semiconductor device of claim 5, wherein
the dielectric structure includes
a first interlayer dielectric layer covering the buried structure, and
a second interlayer dielectric layer on the first interlayer dielectric layer, and
the recessed region is formed in the second interlayer dielectric layer to expose the first interlayer dielectric layer.

7. The semiconductor device of claim 5, further comprising:
a first impurity region adjacent to a first sidewall of the word line in the semiconductor substrate; and
a first contact plug interposed between the first impurity region and the first electrode.

8. The semiconductor device of claim 7, further comprising:
a second impurity region adjacent to a second sidewall of the word line in the semiconductor substrate, the second sidewall being opposite to the first sidewall;
a second contact plug contacting the second impurity region on the semiconductor substrate; and
a bit line contacting the second contact plug and disposed under the first electrode.

9. The semiconductor device of claim 8, further comprising:
a peripheral gate electrode on the semiconductor substrate at the second region,
wherein a top surface of the peripheral gate electrode is at a same level as a top surface of the bit line.

10. A semiconductor device, comprising:
a semiconductor substrate including a first region and a second region;
a word line buried in the semiconductor substrate at the first region;
a first impurity region adjacent to a first sidewall of the word line in the semiconductor substrate;
a second impurity region adjacent to a second sidewall of the word line in the semiconductor substrate, the second sidewall being opposite to the first sidewall;
a bit line crossing over the word line and disposed on the semiconductor substrate at the first region, the bit line connected to the second impurity region;
a dielectric structure provided on the semiconductor substrate at the second region, the dielectric structure having a recessed region;
a first electrode connected to first impurity region provided at the first region;
a dielectric layer covering the first electrode;
a second electrode provided on the dielectric layer; and
a dummy pattern provided in the recessed region,
wherein the dummy pattern is formed of an insulating material or a conductive material.

11. The semiconductor device of claim 10, wherein the second electrode and the dummy pattern are formed of a same conductive material.

12. The semiconductor device of claim 10, further comprising:
a channel region positioned below a top surface of the semiconductor substrate at the first region.

13. The semiconductor device of claim 10, wherein
the dielectric structure includes
a first interlayer dielectric layer covering a buried structure that is buried in the semiconductor substrate at the second region, and
a second interlayer dielectric layer on the first interlayer dielectric layer,
the recessed region is formed in the second interlayer dielectric layer to expose the first interlayer dielectric layer, and
the first interlayer dielectric layer extends onto the first region to be interposed between the bit line and the semiconductor substrate.

14. The semiconductor device of claim 10, further comprising:
a buried pattern buried in the semiconductor substrate at the second region.

15. The semiconductor device of claim 14, wherein a top surface of the buried pattern is at a same level as a top surface of the word line.

16. A semiconductor device, comprising:
a semiconductor substrate including a first region and a second region;
a dielectric structure provided on the semiconductor substrate at the second region, the dielectric structure having a stepwise region;
lower electrodes on the semiconductor substrate at the first region;
a dielectric layer covering the lower electrodes;
an upper electrode on the dielectric layer;
a plate electrode on the upper electrode; and
a dummy pattern provided in the stepwise region,
wherein the dummy pattern has a different structure from the stepwise region.

17. The semiconductor device of claim 16, wherein the dummy pattern is formed of a same material as at least one of the lower electrodes, the dielectric layer, the upper electrode and the plate electrode.

18. The semiconductor device of claim 16, further comprising:
word lines buried in the semiconductor substrate at the first region; and
bit lines crossing over the word lines on the semiconductor substrate at the first region.

19. The semiconductor device of claim 18, wherein
the dielectric structure includes
a first interlayer dielectric layer covering a buried structure that is buried in the semiconductor substrate at the second region, and a second interlayer dielectric layer on the first interlayer dielectric layer, the second interlayer dielectric layer has an opening to expose the first interlayer dielectric layer, the opening forming the stepwise region, and the first interlayer dielectric layer extends onto the first region to be interposed between the bit lines and the semiconductor substrate.

20. The semiconductor device of claim 16, further comprising:

a channel region positioned below a top surface of the semiconductor substrate at the first region.

* * * * *